(12) United States Patent
Merget et al.

(10) Patent No.: US 12,115,644 B2
(45) Date of Patent: Oct. 15, 2024

(54) CONTACTLESS TRIGGER WITH ROTATIONAL MAGNETIC SENSOR FOR A POWER TOOL

(71) Applicant: MILWAUKEE ELECTRIC TOOL CORPORATION, Brookfield, WI (US)

(72) Inventors: Maxwell L. Merget, Milwaukee, WI (US); Douglas R. Fieldbinder, Greendale, WI (US); Jacob P. Schneider, Cedarburg, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 0 days.

(21) Appl. No.: 18/490,295

(22) Filed: Oct. 19, 2023

(65) Prior Publication Data
US 2024/0042591 A1 Feb. 8, 2024

Related U.S. Application Data

(63) Continuation of application No. 17/056,090, filed as application No. PCT/US2020/032442 on May 12, 2020, now Pat. No. 11,890,741.

(51) Int. Cl.
*B25F 5/02* (2006.01)
*H01H 13/14* (2006.01)
*H01H 13/20* (2006.01)

(52) U.S. Cl.
CPC ............ *B25F 5/02* (2013.01); *H01H 13/14* (2013.01); *H01H 13/20* (2013.01)

(58) Field of Classification Search
CPC ............ H03K 17/97; B25F 5/02; H01H 13/14
See application file for complete search history.

(56) References Cited

U.S. PATENT DOCUMENTS

| 4,820,962 A | 4/1989 | Millauer |
| 4,830,549 A | 5/1989 | Neumaier et al. |
| 5,235,261 A | 8/1993 | Philipp |

(Continued)

FOREIGN PATENT DOCUMENTS

| CN | 103534067 A | 1/2014 |
| CN | 104541737 A | 4/2015 |

(Continued)

OTHER PUBLICATIONS

International Search Report and Written Opinion for Application No. PCT/US2020/032442 dated Aug. 27, 2020 (9 pages).

(Continued)

*Primary Examiner* — Daniel Jeremy Leeds
(74) *Attorney, Agent, or Firm* — Michael Best & Friedrich LLP

(57) ABSTRACT

A trigger assembly for a power tool includes a housing, a moveable plunger extending from a surface of the housing, the movable plunger includes a first end disposed externally from the housing and a second end disposed internally within the housing. The trigger assembly further includes a trigger shoe coupled to the first end of the moveable plunger, and an arm including a first side that is moveably connected to the second end of the moveably plunger and a second side that is coupled to a magnet. The trigger assembly also includes a sensor configured to sense a magnetic field of the magnet. Movement of the trigger shoe rotates the magnet, and alters the magnetic field sensed by the sensor.

20 Claims, 21 Drawing Sheets

(56) References Cited

U.S. PATENT DOCUMENTS

| | | |
|---|---|---|
| 5,365,155 A | 11/1994 | Zimmermann |
| 5,847,908 A | 12/1998 | Herbstritt |
| 6,658,829 B2 | 12/2003 | Kobayashi et al. |
| 6,891,457 B2 | 5/2005 | Sako |
| 6,933,689 B2 | 8/2005 | Yamamoto |
| 7,053,567 B2 | 5/2006 | Yamamoto |
| 7,076,830 B2 | 7/2006 | Conner et al. |
| 7,090,030 B2 | 8/2006 | Miller |
| 7,174,972 B2 | 2/2007 | Kristen et al. |
| 7,210,541 B2 | 5/2007 | Miller |
| 7,242,390 B2 | 7/2007 | Bader et al. |
| 7,359,628 B2 | 4/2008 | Broghammer et al. |
| 7,411,144 B2 | 8/2008 | Broghammer |
| 7,732,747 B2 | 6/2010 | Wieler et al. |
| 7,868,263 B2 | 1/2011 | Hammerstingl et al. |
| 8,011,441 B2 | 9/2011 | Leimbach et al. |
| 8,011,547 B2 | 9/2011 | Leimbach et al. |
| 8,210,273 B2 | 7/2012 | Suzuki et al. |
| 8,230,941 B2 | 7/2012 | Leimbach et al. |
| 8,261,642 B2 | 9/2012 | Brandstrom et al. |
| 8,267,296 B2 | 9/2012 | Leimbach et al. |
| 8,267,297 B2 | 9/2012 | Leimbach et al. |
| 8,286,722 B2 | 10/2012 | Leimbach et al. |
| 8,387,718 B2 | 3/2013 | Leimbach et al. |
| 8,587,230 B2 | 11/2013 | Pant et al. |
| 8,587,231 B2 | 11/2013 | Pant |
| 8,602,282 B2 | 12/2013 | Leimbach et al. |
| 8,616,300 B2 | 12/2013 | Suzuki et al. |
| 8,636,079 B2 | 1/2014 | Totsu |
| 8,657,032 B2 | 2/2014 | Numata |
| 8,689,901 B2 | 4/2014 | Chen |
| 8,763,874 B2 | 7/2014 | McCardle et al. |
| 8,810,085 B2 | 8/2014 | Matsunaga et al. |
| 8,813,370 B2 | 8/2014 | Pellenc |
| 8,833,221 B2 | 9/2014 | Tomita et al. |
| 8,833,234 B2 | 9/2014 | Gronau et al. |
| 8,856,555 B2 | 10/2014 | Heydron et al. |
| 8,875,804 B2 | 11/2014 | Puzio et al. |
| 8,995,907 B2 | 3/2015 | Joseph |
| 9,415,488 B2 | 8/2016 | Puzio et al. |
| 9,450,471 B2 | 9/2016 | Mergener et al. |
| 9,451,976 B2 | 9/2016 | Schneider et al. |
| 9,563,219 B2 | 2/2017 | Heydron et al. |
| 9,654,050 B2 | 5/2017 | Kokinelis et al. |
| 9,676,088 B2 | 6/2017 | Leimbach et al. |
| 9,706,706 B2 | 7/2017 | Barendrecht |
| 9,774,229 B1 | 9/2017 | Mergener et al. |
| 9,954,417 B2 | 4/2018 | Mergener et al. |
| 9,960,656 B2 | 5/2018 | Mergener et al. |
| 10,240,881 B1 | 3/2019 | Galie et al. |
| 10,414,436 B1 | 9/2019 | Bonny |
| 11,172,604 B2 | 11/2021 | Yang et al. |
| 2004/0206519 A1 | 10/2004 | Kristen et al. |
| 2007/0144753 A1 | 6/2007 | Miller |
| 2008/0053805 A1 | 3/2008 | Wanek |
| 2009/0173510 A1 | 7/2009 | Milbourne et al. |
| 2009/0308628 A1 | 12/2009 | Totsu |
| 2010/0326804 A1 | 12/2010 | Saur |
| 2011/0291777 A1 | 12/2011 | Stiltz et al. |
| 2012/0162847 A1 | 6/2012 | Suzuki et al. |
| 2012/0312573 A1 | 12/2012 | Yanagihara |
| 2013/0046448 A1 | 2/2013 | Fan et al. |
| 2013/0256274 A1 | 10/2013 | Faulkner |
| 2013/0292147 A1 | 11/2013 | Mergener et al. |
| 2014/0008090 A1 | 1/2014 | Kokinelis et al. |
| 2014/0047913 A1 | 2/2014 | Waite et al. |
| 2014/0100687 A1 | 4/2014 | Ekstrom et al. |
| 2014/0321930 A1 | 10/2014 | Dengler et al. |
| 2015/0097641 A1 | 4/2015 | Chen |
| 2016/0012994 A1 | 1/2016 | Boffelli et al. |
| 2016/0081267 A1 | 3/2016 | Barendrecht |
| 2016/0221085 A1 | 8/2016 | Zhong et al. |
| 2016/0359392 A1 | 12/2016 | Mergener et al. |
| 2017/0165824 A1 | 6/2017 | Takeda |
| 2017/0266796 A1 | 9/2017 | Leimbach et al. |
| 2018/0082805 A1 | 3/2018 | Fangmann |
| 2018/0082808 A1 | 3/2018 | Fangmann |
| 2018/0091145 A1 | 3/2018 | Dey, IV et al. |
| 2018/0248446 A1 | 8/2018 | Mergener et al. |
| 2019/0299795 A1 | 10/2019 | Yan et al. |
| 2020/0043684 A1 | 2/2020 | Olsson et al. |
| 2020/0245555 A1 | 8/2020 | Colber et al. |
| 2021/0243946 A1 | 8/2021 | Yang et al. |
| 2022/0134532 A1 | 5/2022 | Merget et al. |
| 2022/0254587 A1 | 8/2022 | McCue et al. |

FOREIGN PATENT DOCUMENTS

| | | |
|---|---|---|
| CN | 106997821 A | 8/2017 |
| CN | 111756280 A | 10/2020 |
| DE | 9211412 U1 | 12/1992 |
| DE | 19825433 A1 | 1/1999 |
| DE | 19953204 A1 | 5/2001 |
| DE | 102007043035 A1 | 3/2009 |
| DE | 102013212573 A1 | 12/2014 |
| EP | 1788597 B1 | 12/2008 |
| EP | 2110830 A2 | 10/2009 |
| EP | 2682235 A2 | 1/2014 |
| EP | 2395527 B1 | 3/2015 |
| EP | 2946710 B1 | 8/2017 |
| EP | 3545744 A1 | 10/2019 |
| JP | 2006120466 A | 5/2006 |
| KR | 1020100080198 A | 7/2010 |
| WO | 2011151147 A1 | 12/2011 |
| WO | 2014031539 A1 | 2/2014 |

OTHER PUBLICATIONS

Extended European Search Report for Application No. 20806375.0 date Dec. 12, 2022 (7 pages).

Chinese Patent Office Action for Application No. 202080049020.1 dated Sep. 27, 2023 (20 pages including machine English translation).

CONTACTLESS TRIGGER WITH ROTATIONAL MAGNETIC SENSOR FOR A POWER TOOL

RELATED APPLICATIONS

This application claims the benefit of U.S. patent application Ser. No. 17/056,090, filed Nov. 17, 2020, which is a national phase filing under 35 U.S.C. § 371 of International Application No. PCT/US2020/032442, filed May 12, 2020, which claims the benefit of U.S. Provisional Patent Application No. 62/847,103, filed May 13, 2019, and U.S. Provisional Patent Application No. 62/870,353, filed Jul. 3, 2019, the entire content of each of which is hereby incorporated by reference.

FIELD

Embodiments described herein relate to a trigger or other user input for electronic power tools.

SUMMARY

Input devices, such as a trigger on a power tool, may be physically coupled to one or more electronic components, such as variable resistors, relays, and the like. Physical connections on input devices, including triggers, may wear over time, thereby reducing the operational life of the tool. Thus, it would be advantageous to utilize contactless sensing device to reduce wear and increase life of the input devices and/or the power tool.

In one embodiment, a trigger assembly for a power tool includes a housing, a moveable plunger extending from a surface of the housing, the movable plunger includes a first end disposed externally from the housing and a second end disposed internally within the housing. The trigger assembly further includes a trigger shoe coupled to the first end of the moveable plunger, and an arm including a first side that is moveably connected to the second end of the moveably plunger and a second side that is coupled to a magnet. The trigger assembly also includes a sensor configured to sense a magnetic field of the magnet. Movement of the trigger shoe rotates the magnet, and alters the magnetic field sensed by the sensor.

The sensor of the above trigger assembly may be configured to be in electronically coupled to a controller of the power tool, and the controller may be configured to control an output of the power tool.

The sensor of the above trigger assembly may also be configured to output a signal to the controller based on the sensed magnetic field.

The output of the sensor in the above trigger assembly may be a voltage indicative of a position of the trigger shoe.

The above trigger assembly, wherein the magnet may be an annular magnet configured to rotate based on movement of the arm.

The above trigger assembly, wherein the sensor may be configured to sense a change in the magnetic field of the annular magnet in response to the annular magnet rotating.

The above trigger assembly may further include a selector disposed on a surface of the housing. The trigger assembly may further include a pin including a first end that is engageable with the selector and a second end that is coupled to the selector magnet, and a selector sensor configured to sense a magnetic field of the selector magnet. The axial motion of the selector may be configured to rotate the selector magnet, thereby altering the magnetic field sensed by the sensor.

The above trigger assembly, wherein the selector sensor may be configured to sense a polarity of the selector magnet, and output a digital signal to the controller based on the sensed polarity.

The above trigger assembly, wherein the controller may be configured to execute an operating mode selected from a number of operating modes of the power tool based on the digital signal received from the selector sensor.

The above trigger assembly, wherein operating modes of the power tool may include a forward operating mode and a reverse operating mode.

In an additional embodiment, a method for controlling an output of an electric power tool is described, according to some embodiments. The method includes actuating a trigger shoe of the electric power tool in a first linear direction, wherein the actuation of the trigger shoe moves a movable plunger in the first linear direction. The method further includes converting the linear movement of the movable plunger into a rotation movement of a movable arm in a first rotational direction, and rotating an annular magnet coupled to the movable arm in the first rotational direction. The method also includes sensing a parameter of a magnetic field generated by the annular magnet at a first magnetic sensor and converting the parameter of the rotating magnetic field to an output voltage. The method also includes receiving, at a controller of the electric power tool, the output voltage, and controlling the output of the electric power tool based on the received output voltage.

The above method may also include the output of the electric power tool being a rotational speed.

The above method may also include the sensed parameter being a magnetic flux density vector component.

The above method may also include the first magnetic sensor being an analog rotational magnetic field sensor.

The above method may also include sensing a parameter of the magnetic field generated by the annular magnet at a second magnetic sensor, wherein the second magnetic sensor is a digital magnetic sensor.

The above method may also include initiating a wake-up process for the controller based on the controller receiving an output of the second magnetic sensor.

In another embodiment, a power tool is described. The power tool includes a trigger assembly. The trigger assembly includes a trigger shoe configured to be actuated in a first linear direction, wherein the actuation of the trigger shoe moves a movable plunger in the first linear direction. The trigger assembly further includes a movable arm configured to convert the linear movement of the movable plunger into a rotational movement of a movable arm in a first rotational direction, the movable arm further configured to rotate an annular magnet coupled to the movable arm in the first rotational direction. The trigger assembly also includes a magnetic sensor configured to sense a first parameter of a magnetic field generated by the annular magnet, wherein the magnetic sensor is configured to convert the magnetic field to an output voltage representative of a position of the trigger shoe. The power tool also includes a controller configured to receive the output voltage from the magnetic sensor and control the output of the power tool based on the received output voltage.

The above described power tool, wherein the output of the power tool may be a rotational speed.

The above described power tool may also include a second magnetic sensor configured to sense a second parameter of the annular magnet and transmit an output of the controller, wherein the second magnetic sensor is a digital magnetic sensor, and the second parameter is a polarity of the annular magnet.

The above described power tool, wherein the controller is further configured to initiate a wake-up process for the controller based on the controller receiving the output of the second magnetic sensor.

Before any embodiments are explained in detail, it is to be understood that the embodiments are not limited in its application to the details of the configuration and arrangement of components set forth in the following description or illustrated in the accompanying drawings. The embodiments are capable of being practiced or of being carried out in various ways. Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects may be implemented in software (e.g., stored on non-transitory computer-readable medium) executable by one or more processing units, such as a microprocessor and/or application specific integrated circuits ("ASICs"). As such, it should be noted that a plurality of hardware and software based devices, as well as a plurality of different structural components, may be utilized to implement the embodiments. For example, "servers," "computing devices," "controllers," "processors," etc., described in the specification can include one or more processing units, one or more computer-readable medium modules, one or more input/output interfaces, and various connections (e.g., a system bus) connecting the components.

Relative terminology, such as, for example, "about," "approximately," "substantially," etc., used in connection with a quantity or condition would be understood by those of ordinary skill to be inclusive of the stated value and has the meaning dictated by the context (e.g., the term includes at least the degree of error associated with the measurement accuracy, tolerances [e.g., manufacturing, assembly, use, etc.] associated with the particular value, etc.). Such terminology should also be considered as disclosing the range defined by the absolute values of the two endpoints. For example, the expression "from about 2 to about 4" also discloses the range "from 2 to 4". The relative terminology may refer to plus or minus a percentage (e.g., 1%, 5%, 10%, or more) of an indicated value.

It should be understood that although certain drawings illustrate hardware and software located within particular devices, these depictions are for illustrative purposes only. Functionality described herein as being performed by one component may be performed by multiple components in a distributed manner. Likewise, functionality performed by multiple components may be consolidated and performed by a single component. In some embodiments, the illustrated components may be combined or divided into separate software, firmware and/or hardware. For example, instead of being located within and performed by a single electronic processor, logic and processing may be distributed among multiple electronic processors. Regardless of how they are combined or divided, hardware and software components may be located on the same computing device or may be distributed among different computing devices connected by one or more networks or other suitable communication links. Similarly, a component described as performing particular functionality may also perform additional functionality not described herein. For example, a device or structure that is "configured" in a certain way is configured in at least that way but may also be configured in ways that are not explicitly listed.

Other aspects of the embodiments will become apparent by consideration of the detailed description and accompanying drawings.

DETAILED DESCRIPTION

Figure 1:
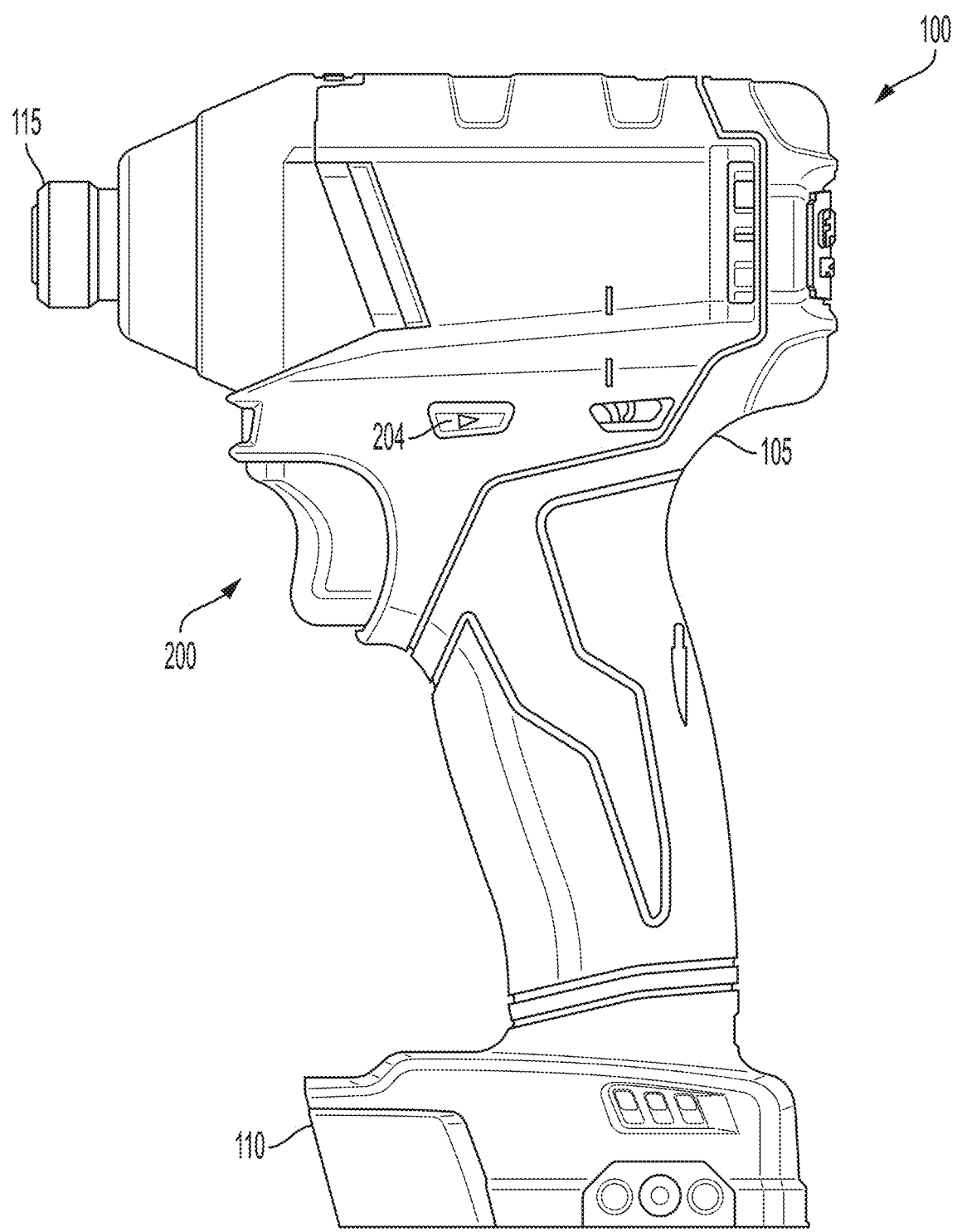
FIG. 1 is a perspective view of a power tool including a contactless trigger, according to some embodiments.

FIG. 1 illustrates an example power tool 100, according to one embodiment. The power tool includes a housing 105, a battery pack interface 110, a driver 115 (e.g., a chuck or bit holder), and a contactless trigger assembly 200. The power tool 100 may further have a mode selection device. For example, the mode selection device may be a forward-reverse selector 204, which can allow a user to control the direction of a rotating portion of the tool. While FIG. 1 shows a specific power tool with a rotational output, it is contemplated that the herein described contactless trigger designs may be used with multiple types of power tools, such as drills, drivers, impact drivers, impulse drivers, saws (e.g. band saws, circular saws, miter saws, and the like), lights, hammer drills, nail guns, staple guns, liquid dispenser (e.g. caulk guns), crimping and/or clamping devices, or another type of power tool that uses a brushless DC motor that is controlled via a user input (e.g. a trigger).

Figure 2:
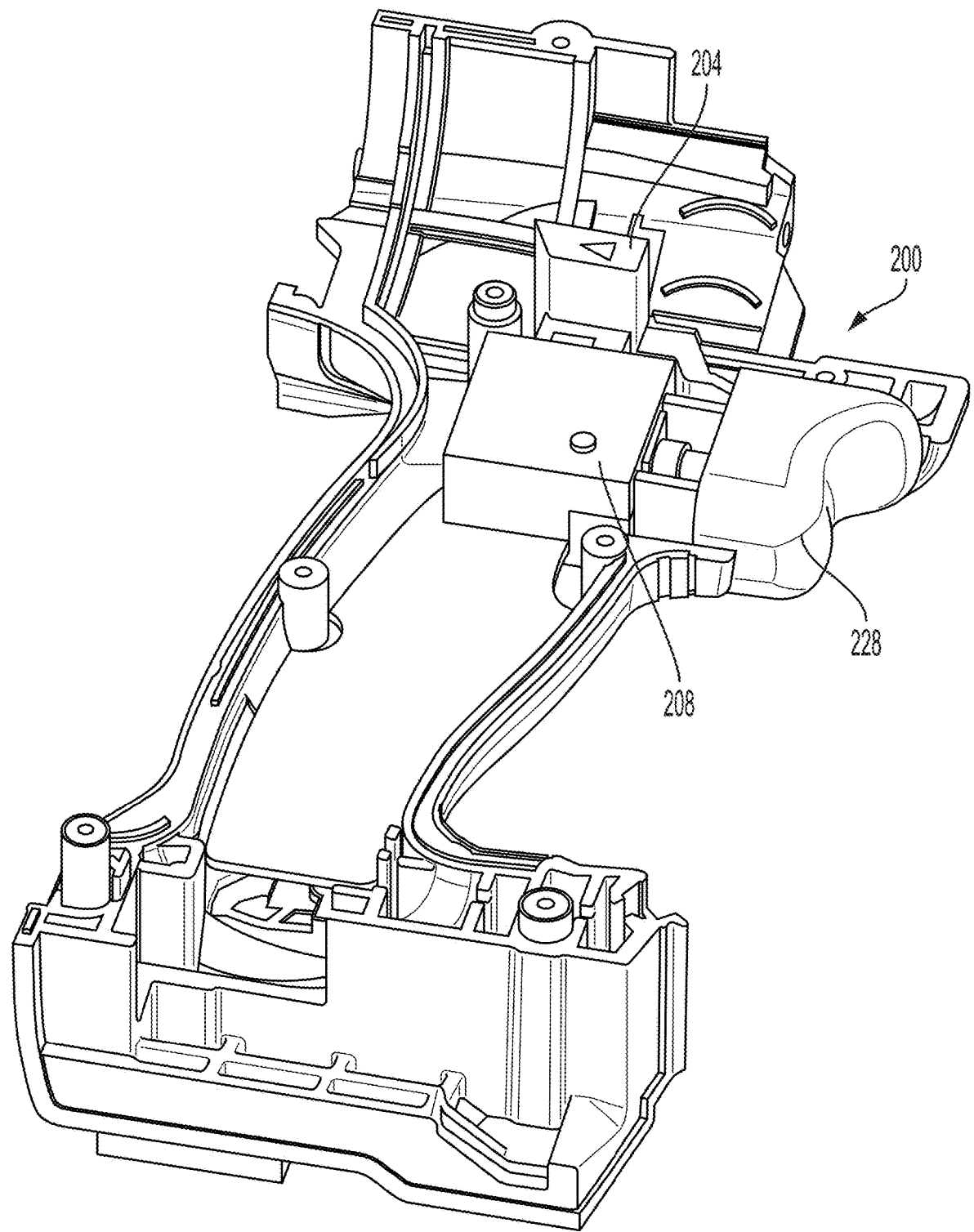
FIG. 2 is a perspective view of the power tool of FIG. 1 with a portion of a housing removed to show the contactless trigger, according to some embodiments.

FIG. 2 illustrates a cross-sectioned view of the power tool 100, according to some embodiments. The contactless trigger assembly 200 (also referred as the trigger 200) and the forward-reverse selector 204 (also referred to as the selector 204) are types of user inputs to a controller associated with the tool 100, as will be described below. For example, the trigger 200 may produce an analog signal indicative of a desired speed or torque that varies based on the travel distance of a trigger shoe 228. For example, an analog magnetic sensor may be in communication with a magnet within the contactless trigger assembly 200. The forward-reverse selector 204, which may be considered part of the contactless trigger assembly, may be able to be moved from a first discrete position to a second discrete position. Similar to above, the forward-reverse selector 204 may include a magnet that is in communication with a magnetic sensor, such as a digital magnetic sensor, thereby outputting a signal to a controller of the tool 100 based on the position of the forward-reverse selector 204. An example of such a controller is described further below (see motor controller 930 in FIG. 15).

Figure 3:
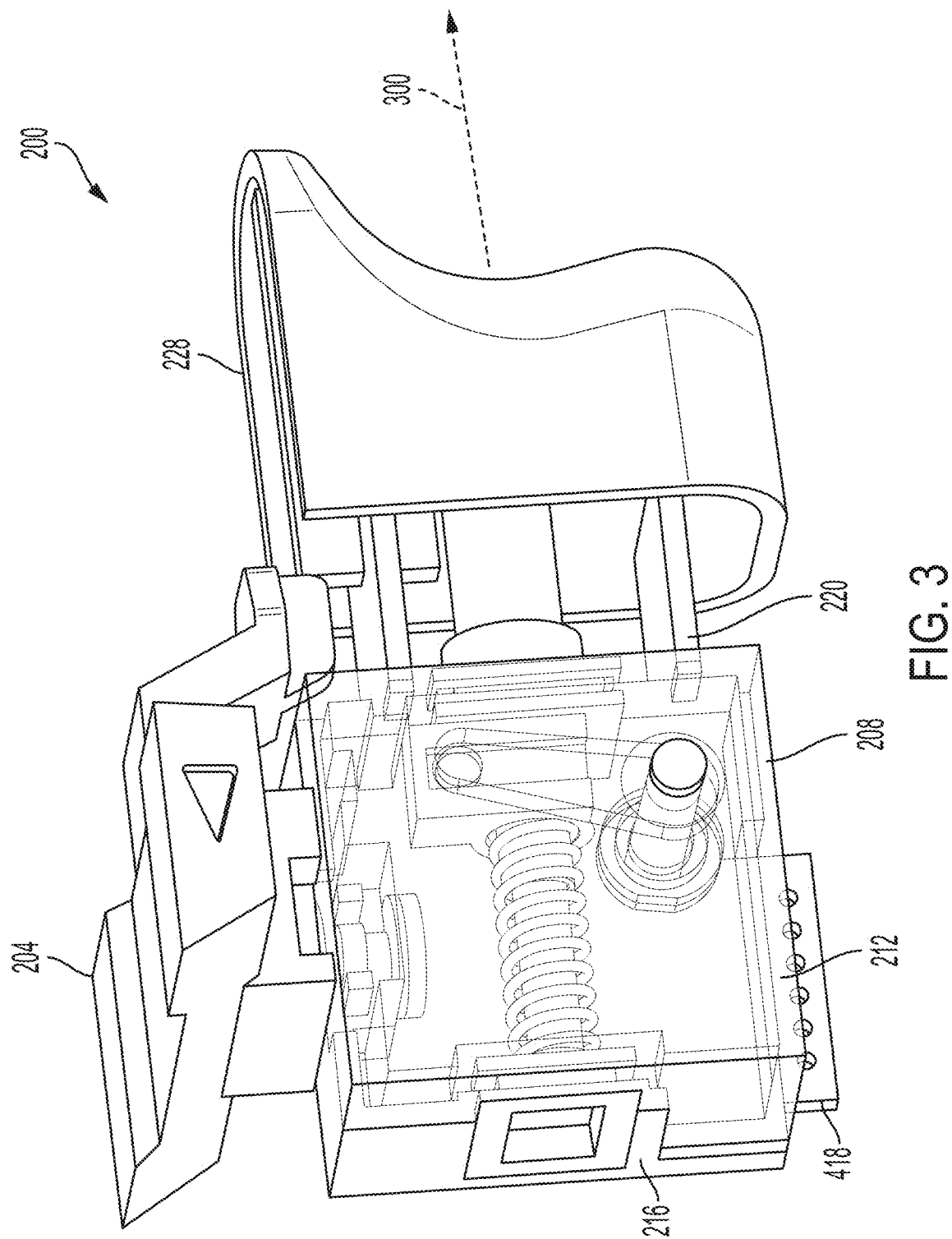
FIG. 3 is a perspective view of the contactless trigger of FIG. 2, according to some embodiments.
Figure 4:
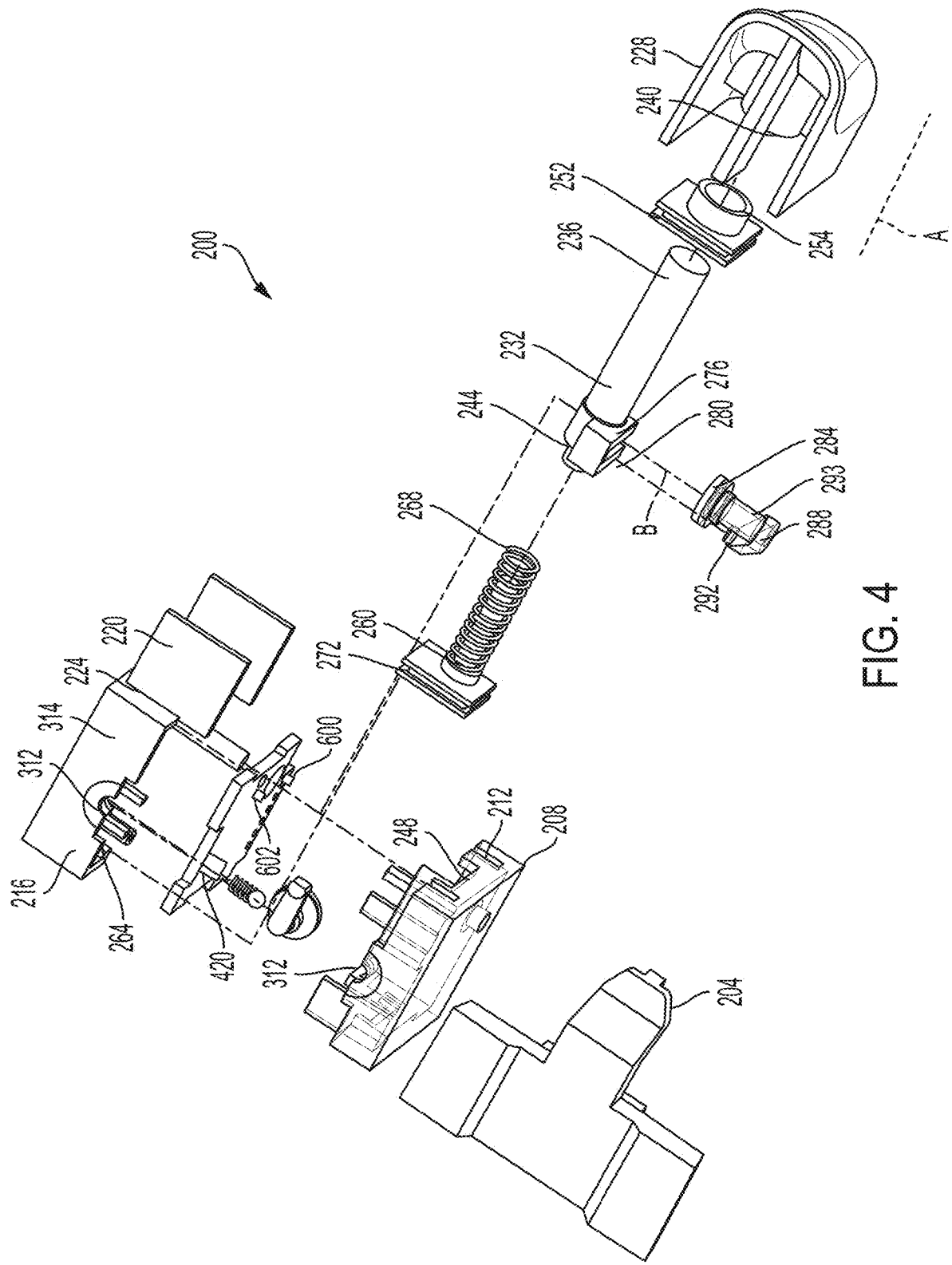
FIG. 4 is an exploded perspective view of the contactless trigger of FIG. 3, according to some embodiments.

FIGS. 3 and 4 illustrate a detailed view of the contactless trigger assembly 200, according to some embodiments. The contactless trigger assembly 200 includes a housing 208 with a first housing section 212 and a second housing section 216 that are removably couplable to one another. The first housing section 212 includes rails 220 extending from a first surface 224 of the housing 208. The first surface 224 of the housing 208 is defined by both the first housing section 212 and the second housing section 216 when the first and second housing sections 212, 216 are coupled. The rails 220 are positioned to allow the trigger shoe 228 to slide along a length of the rails 220, such that the travel distance of the trigger shoe 228 may be actualized. The first surface 224 of the housing 208 further includes a moveable plunger 232 extending therefrom. The moveable plunger 232 includes a first end 236 that is sized to be received by a circular recessed portion 240 of the trigger shoe 228, such that the trigger shoe 228 and the moveable plunger 232 are coupled, providing in sync movement between the trigger shoe 228 and the moveable plunger 232. The diameter of the circular recessed portion 240 is not significantly larger than the diameter of the moveable plunger 232, allowing a tight fitting between the moveable plunger 232 and the trigger shoe 228. In alternate embodiments, the moveable plunger 232 and the trigger shoe 228 may be coupled via alternate means such as fasteners, adhesive, or the like. In some examples, the housing 208 may be omitted, and the above components may be installed directly within the housing 105 of the tool 100.

Figure 5:
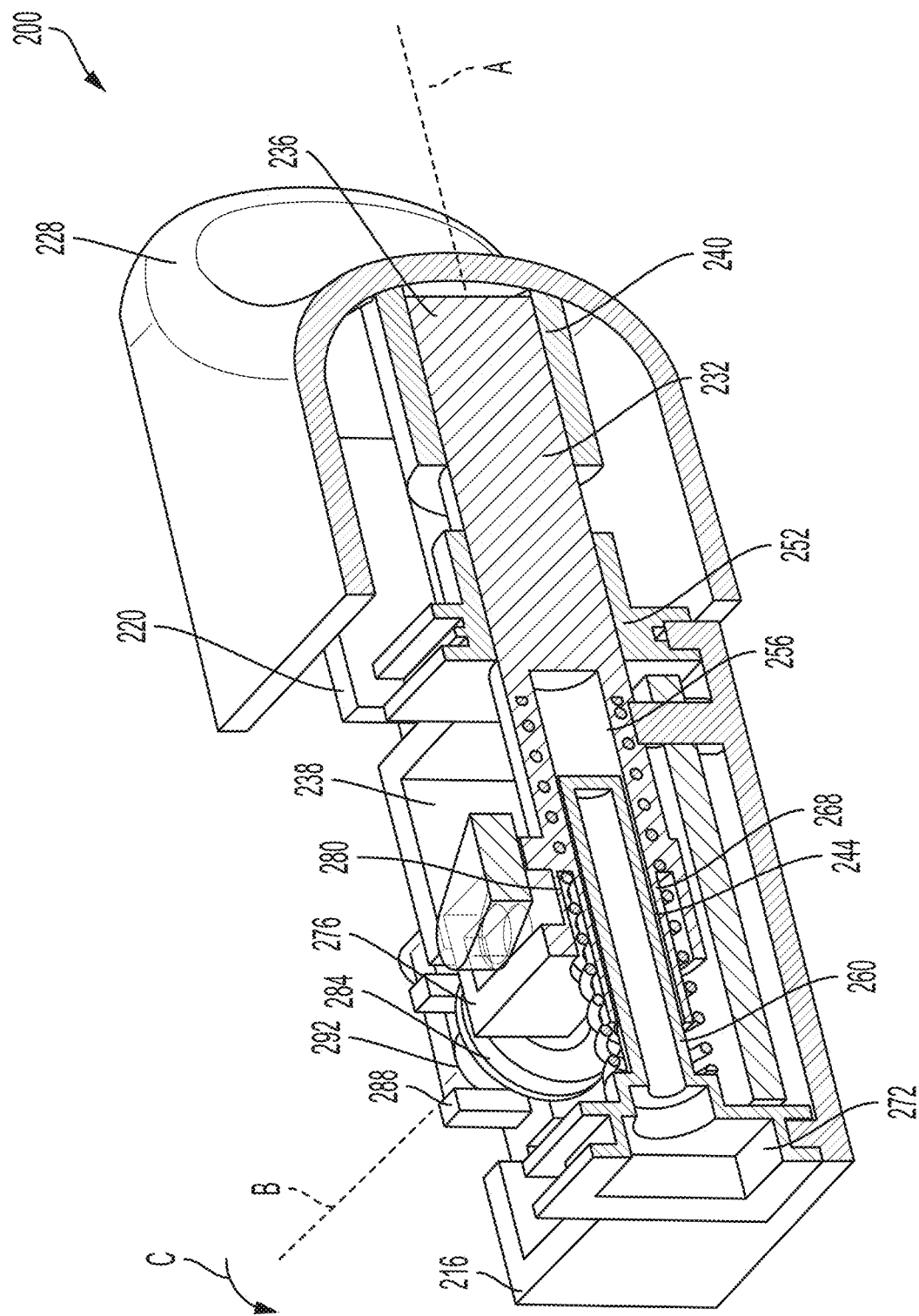
FIG. 5 is a perspective sectional view of the contactless trigger of FIG. 3 with a portion of a housing removed, according to some embodiments.

A second end 244 of the moveable plunger 232, opposite the first end 236 of the moveable plunger 232, is disposed in an internal portion 238 of the housing 208. The first surface 224 includes a hole 248, with an opening member 252 disposed in the hole 248. The moveable plunger 232 is disposed in the opening member 252 such that the moveable plunger 232 slides on an annular surface 254 of the opening member 252, with the first end 236 of the moveable plunger 232 being disposed externally of the housing 208 and the second end 244 of the moveable plunger 232 being disposed internally of the housing 208. The second end 244 of the moveable plunger 232 includes a recessed portion 256 (see FIG. 5) sized to receive a stationary rod 260 that is coupled to an internal surface 264 of the housing 208 that is opposite that of the first surface 224 of the housing 208. As shown in FIG. 5, the recessed portion 256 of the moveable plunger 232 includes a length that is sized to allow the moveable plunger 232 to move the travel distance, such that the trigger shoe 228 moves the travel distance.

With reference to FIGS. 4 and 5, a spring 268 is disposed on the stationary rod 260 and an external surface of the second end 244 of the moveable plunger 232, with the spring 268 being disposed between a plate 272 of the stationary rod 260 and a cam 276 of the moveable plunger 232. The plate 272 of the stationary rod 260 is directly coupled to the internal surface 264 of the housing 208. The cam 276 of the moveable plunger 232 includes a diameter that is larger than the diameter of the spring 268, such that the spring 268 biases a first surface 280 of the cam 276. The cam 276 prevents the second end 244 of the moveable plunger 232 from exiting the internal portion 238 of the housing 208 due to the cam 276 having a larger diameter than that of the opening member 252. The spring 268 biases the first surface 280 of the moveable plunger 232 along an axis A, such that a second surface of the moveable plunger 232 interfaces with the opening member 252.

As illustrated in FIG. 5, the internal portion 238 of the housing 208 further includes an annular magnet 284 coupled to the cam 276 of the moveable plunger 232 via an arm 288. The arm 288 is moveably coupled to the cam 276 via a first pin 292 of the arm 288. The arm 288 is also permanently coupled to the annular magnet 284 via a projection 293. Accordingly, as the moveable plunger 232 moves along the axis A, the arm 288 is rotated about an axis B, which intersects the center of the annular magnet 284, in a direction C. As the arm 288 rotates in the direction C, the annular magnet 284 also rotates in the direction C. Rotation of the annular magnet 284 alters the magnetic field detected by an analog magnetic sensor on a printed circuit board (PCB) 418 (see FIGS. 6A and 6B). In some embodiments, the analog magnetic sensor is an analog rotational magnetic field sensor. The analog rotational magnetic field sensor may be configured to output a linear voltage to a controller of the tool 100 (see, e.g., motor controller 930 of FIG. 15). The linear voltage may be indicative of a position of the trigger shoe 228, and may be used to control an associated parameter of the tool 100, such as the rotational speed of a motor. In other embodiments, the annular magnet 284 may also be in communication with a digital magnetic sensor. The digital magnetic sensor may be configured to transition from a first state to a second state based on detecting a change of the magnetic field produced by the annular magnet 284 in response to rotating as the trigger shoe 228 is depressed.

In other embodiments, the digital magnetic sensor outputs a first value when the rotation magnet produces a magnetic field indicative of the magnet being in a first predefined position (e.g. associated with a fully released trigger shoe 228). The rotational magnetic sensor may then be configured to provide a second value when the magnet transitions away from the first predefined position. The transitional output of the digital magnetic sensor may provide an input to a controller of the tool 100 (see, e.g., motor controller 930 of FIG. 15), which indicates that the controller should turn on (e.g., a wake-up signal). In still further embodiments, the annular magnet 284 may be in communication with only a digital magnetic sensor. For example, in some embodiments, where the tool 100 operates at a single speed or includes a separate speed adjusting mechanism (e.g., a speed dial), only a digital magnetic sensor is included to detect the annular magnet 284.

Figure 6A:
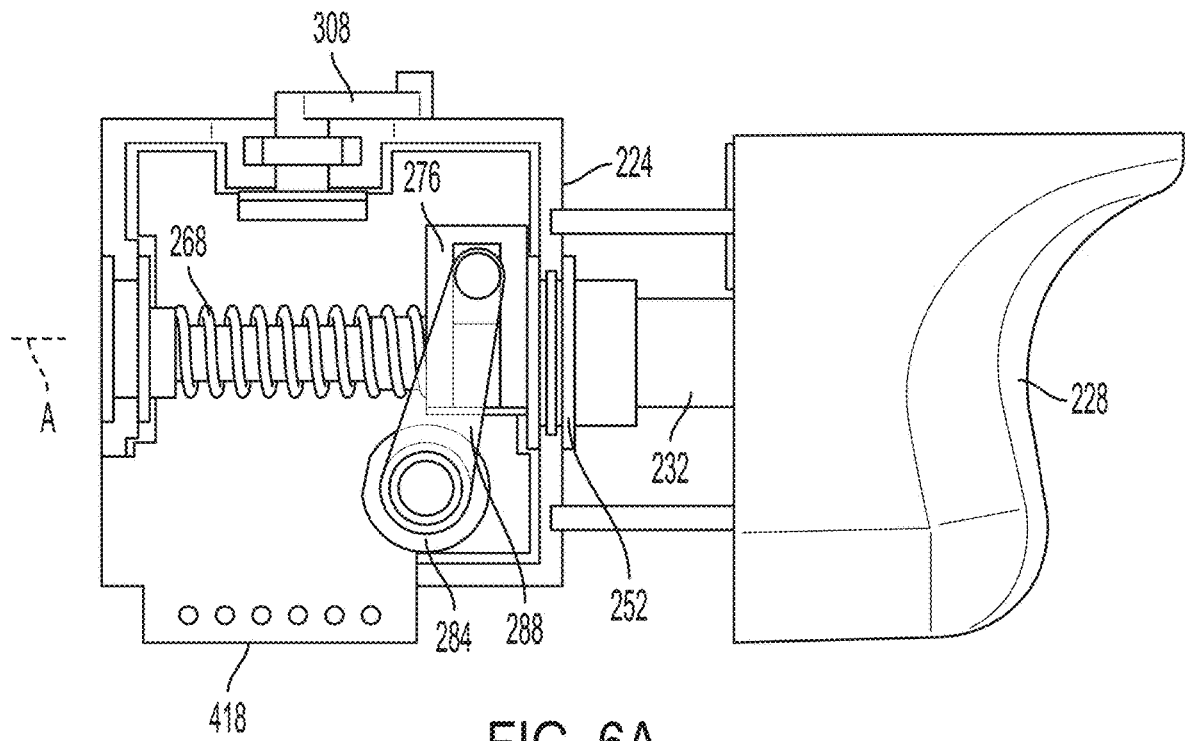
FIG. 6A is a side view of the contactless trigger of FIG. 3 with a portion of a housing removed in a non-depressed position, according to some embodiments.

Turning to FIG. 6A, when the trigger shoe 228 is in a relaxed state, the spring 268 biases the moveable plunger 232 and, thus, the trigger shoe 228, to an extended position relative to the first surface 224 of the housing 208. At this time, the annular magnet 284 is in a first position, with a first magnetic field relative to the PCB 418, which the analog rotational magnetic field sensor detects. The first magnetic field detected by the analog rotational magnetic field sensor is then converted to a first output value, which is then received by a controller of the tool 100.

Figure 6B:
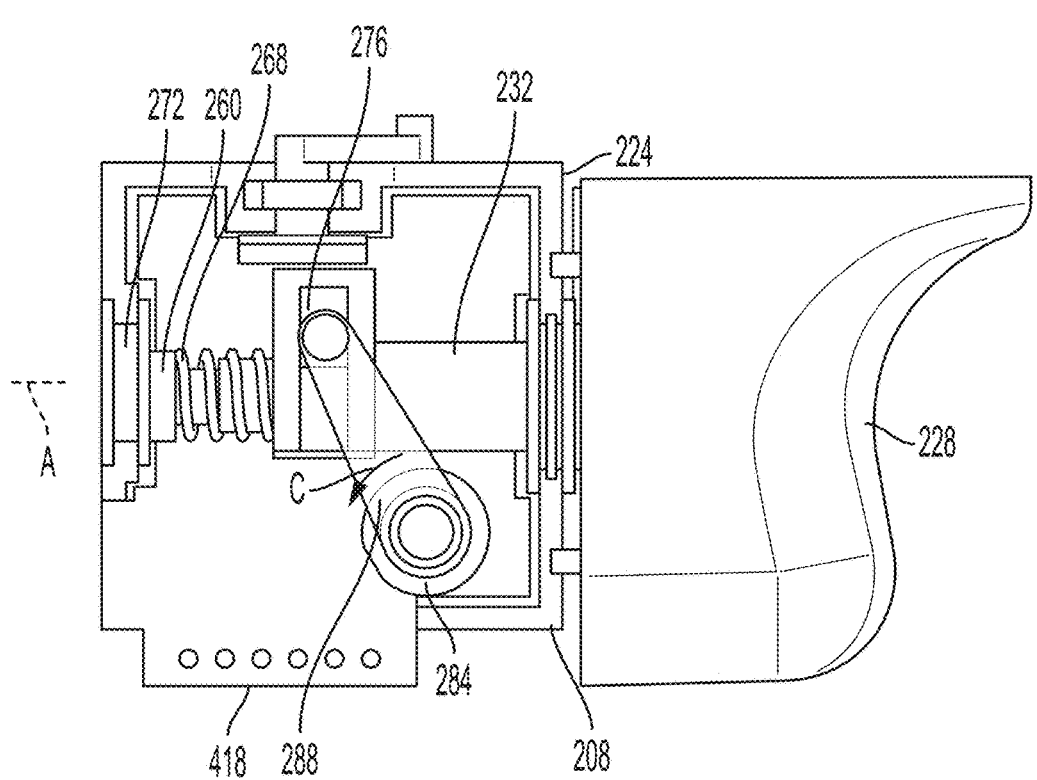
FIG. 6B is a side view of the contactless trigger of FIG. 3 with a portion of a housing removed in a depressed position, according to some embodiments.

Turning to FIG. 6B, when the trigger shoe 228 is depressed, the trigger shoe 228 moves the moveable plunger 232 along the axis A, such that the trigger shoe 228 moves toward the first surface 224 of the housing 208. Movement of the moveable plunger 232 biases the spring 268 toward the plate 272 of the stationary rod 260, thereby, also moving the cam 276 toward the plate 272. This, in turn, causes the arm 288 to pivot about the axis B, rotating the annular magnet 284 about the axis B in the direction C. At this time, the annular magnet 284 is in a second position, with a second magnetic field relative to the PCB 418, which the analog rotational magnetic field sensor detects. The second magnetic field detected by the analog rotational magnetic field sensor is then converted to a second output voltage that is distinct from the first output voltage, which is then received by the controller of the tool 100.

With reference to FIG. 6A, when the force depressing the trigger shoe 228 is removed, the spring 268 biases the cam 276, which moves the moveable plunger 232 and, thus, the trigger shoe 228, along the axis A in a direction away from the first surface 224 of the housing 208. Movement of the cam 276 causes the arm 288 to pivot about the axis B in a direction opposite to that of the direction C. The annular magnet 284 is therefore rotated in the opposite direction to that of the direction C until movement of the cam 276 is inhibited by the opening member 252. At this time, the annular magnet 284 is in the first position, with the first magnetic field, which the analog rotational magnetic field sensor detects. The first magnetic field detected by the analog rotational magnetic field sensor is then converted to the first output voltage, which is then received by the controller of the tool 100.

Figure 7:
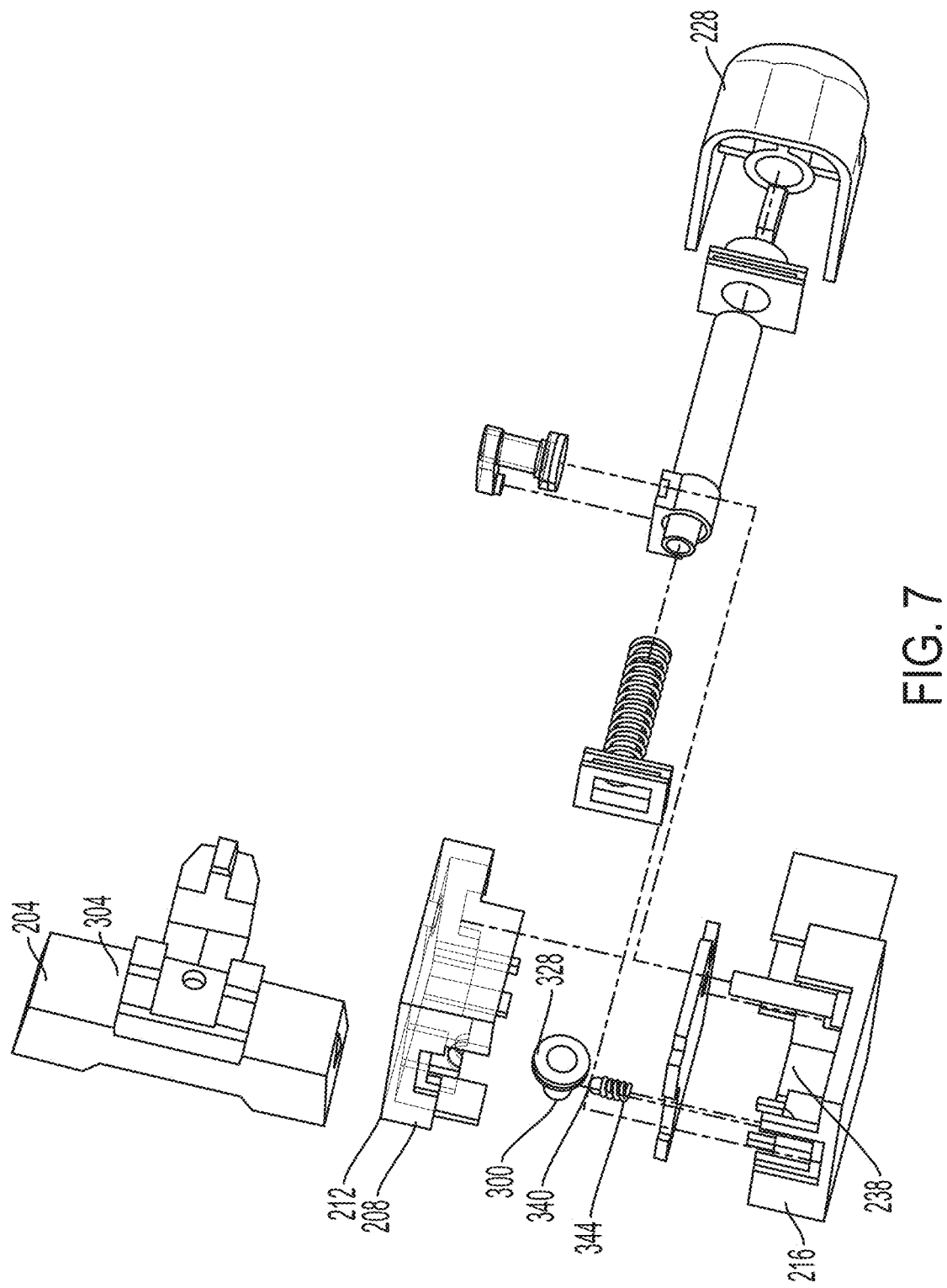
FIG. 7 is an alternate exploded perspective view of the contactless trigger of FIG. 3, according to some embodiments.
Figure 8:
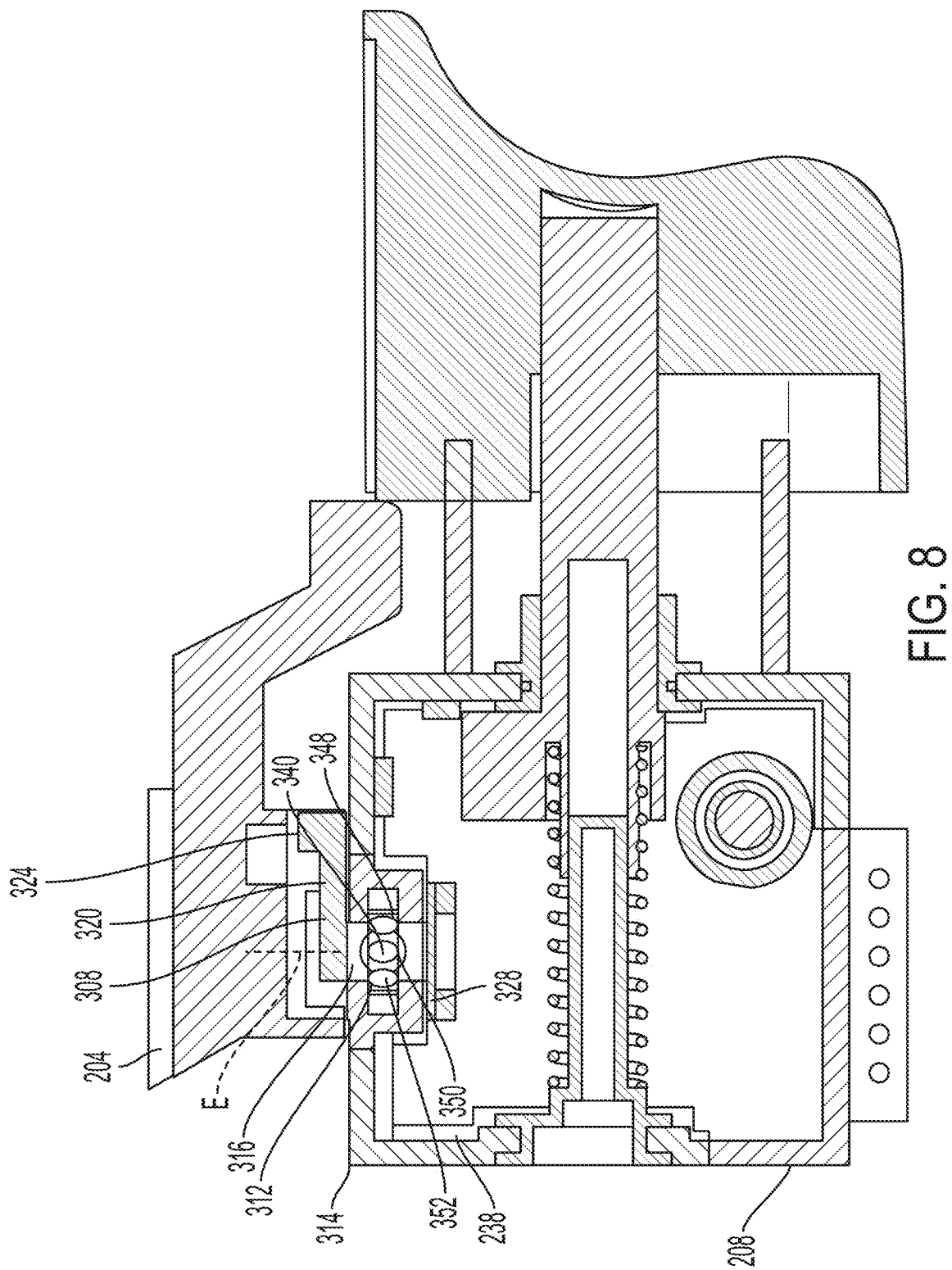
FIG. 8 is a side sectional view of the contactless trigger of FIG. 3, according to some embodiments.

As illustrated in FIGS. 7-8, the contactless trigger 200 includes the forward-reverse selector 204, as described above. A camming assembly 300 communicates with recessed portion walls 304 of the selector 204 via a selector arm 308 (see also FIG. 6) that has a portion extending through an opening 312 (see also FIG. 4) of the housing 208. The opening 312 is defined by both the first housing section 212 and the second housing section 216, on a second surface 314 of the housing 208 that is perpendicular to the first surface 224 of the housing 208.

With reference to FIG. 8, the selector arm 308 includes a center pin portion 316, an intermediate portion 320, and an upwardly extending portion 324. The center pin portion 316 extends through the opening 312 of the housing 208, such that the center pin portion 316 is positioned both in the internal portion 238 of the housing 208 and externally from the housing 208. An end of the center pin portion 316 that is in the internal portion 238 of the housing 208 is coupled to a magnet 328. The intermediate portion 320 is disposed externally of the housing 208 and is integrally connected to the center pin portion 316. The intermediate portion 320 extends away from the opening 312 of the housing 208, along the second surface 314. The upwardly extending portion 324 is integrally connected to the intermediate portion 320 and is perpendicular to the intermediate portion 320, such that the upwardly extending portion 324 extends away from the second surface 314. The upwardly extending portion 324 includes a first side 332 and a second side 336 opposite the first side 332, the first side 332 and the second side 336 are curved (shown in FIG. 9).

A ball detent 340 is disposed in a recess in the internal portion 238 of the housing 208. The ball detent 340 is biased toward an outside surface of the end of the center pin portion 316 via a ball detent spring 344 (see FIG. 7). The outside surface of the center pin portion 316 includes a first recession 348, a second recession 350, and a third recession 352, each sized to receive the ball detent 340.

Figure 9:
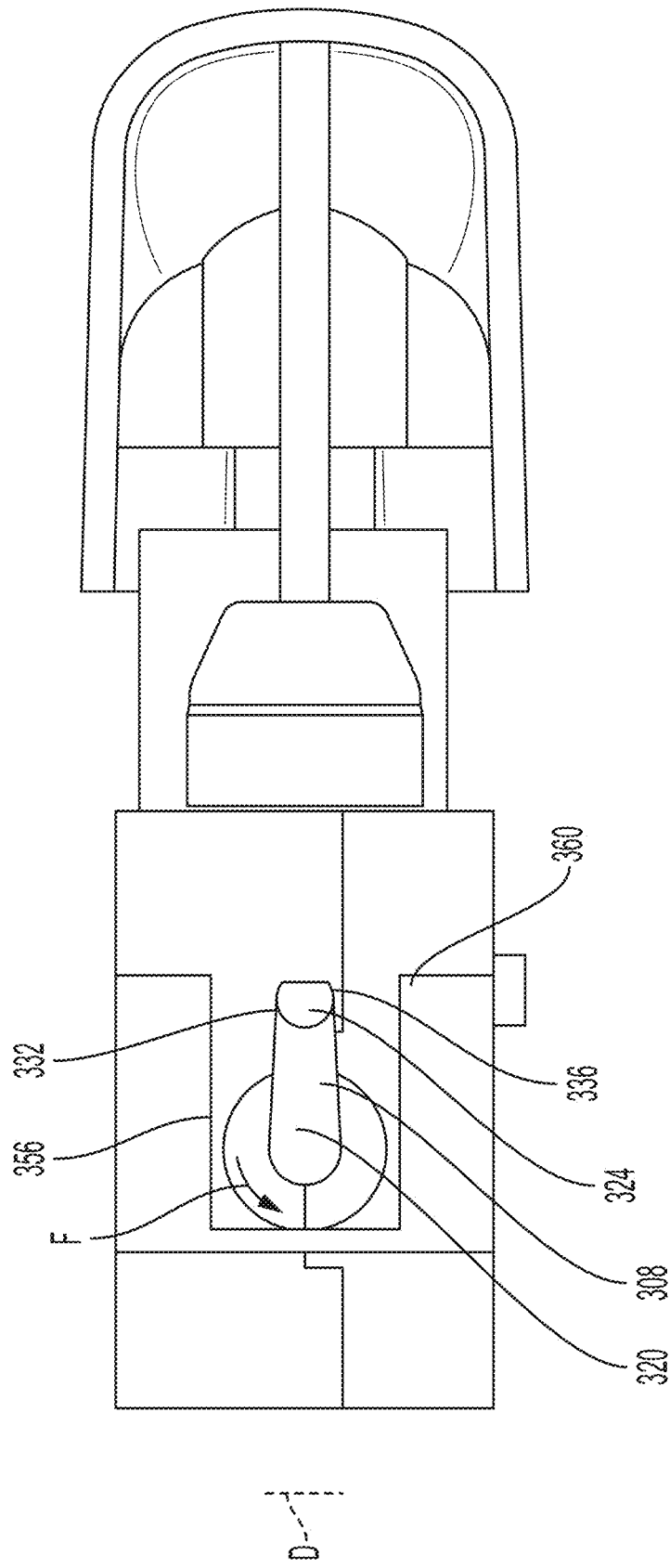
FIG. 9 is a top sectional view of the contactless trigger of FIG. 3, according to some embodiments.
Figure 10A:
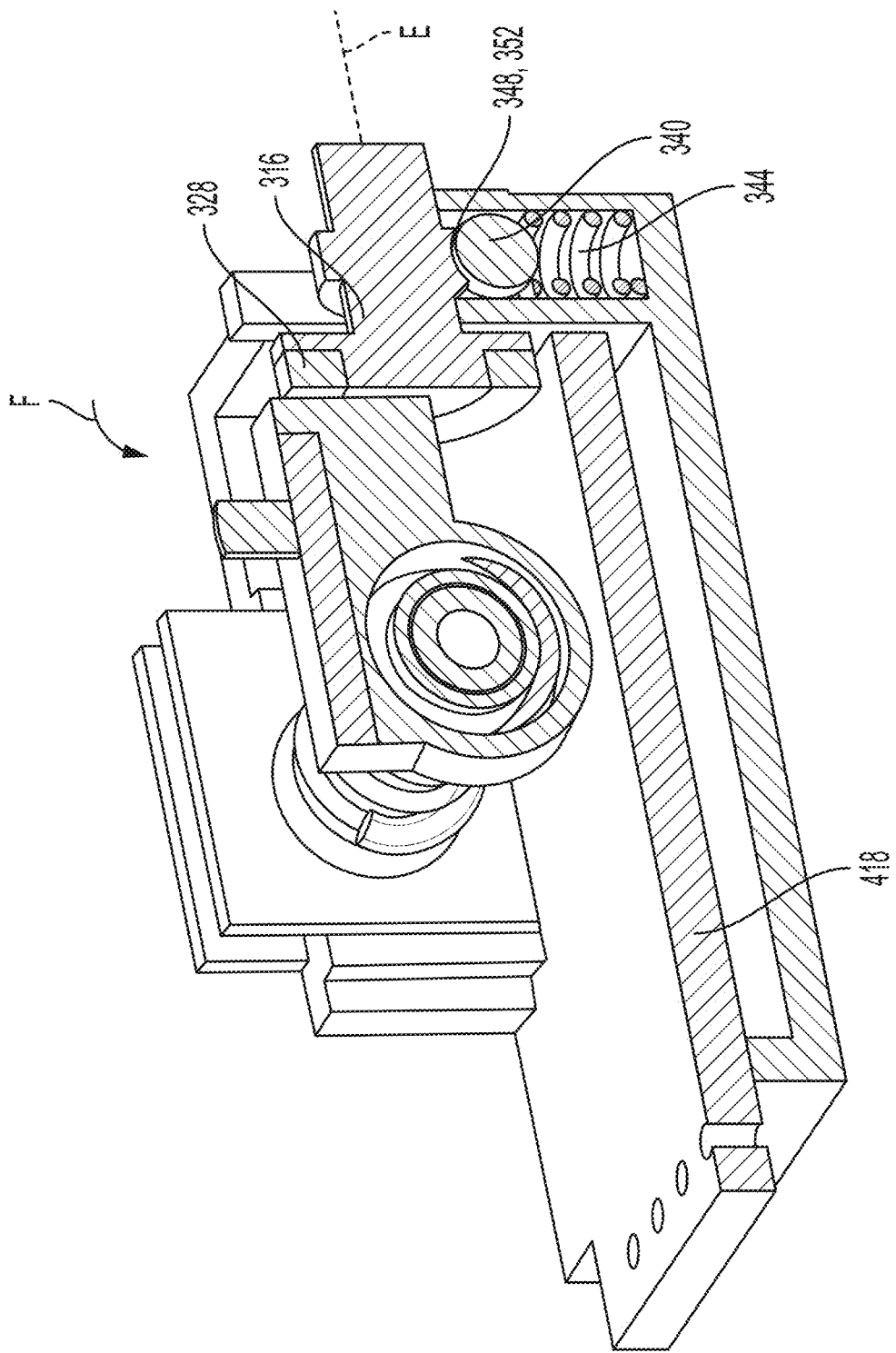
FIG. 10A is a perspective sectional view of the contactless trigger of FIG. 3 with a portion of a housing removed, according to some embodiments.
Figure 10B:
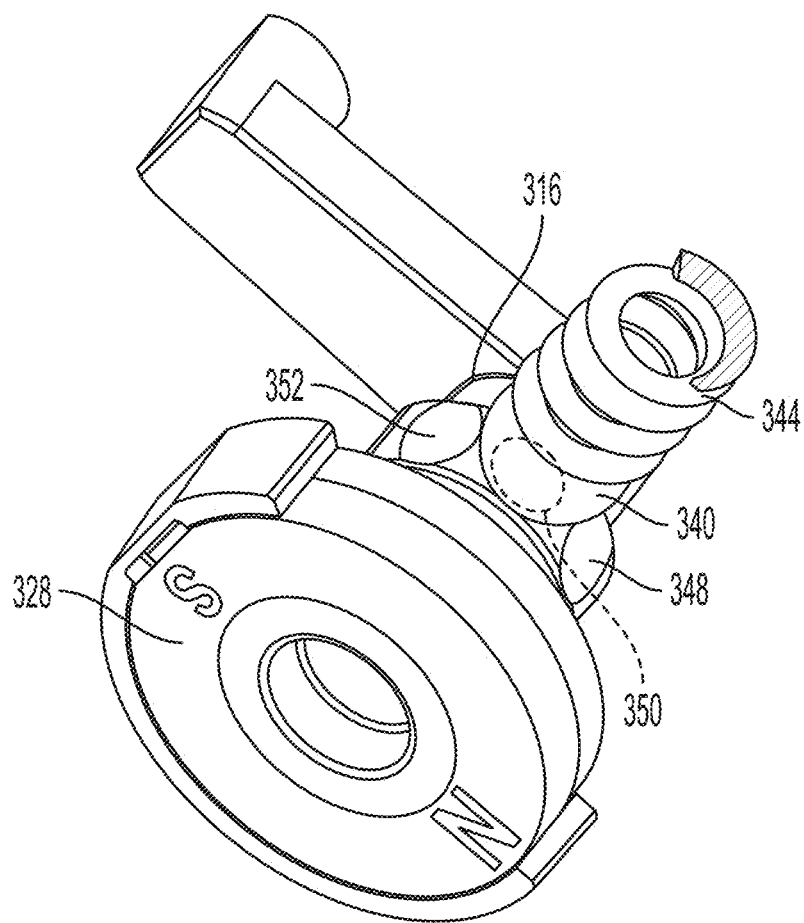
FIG. 10B is a perspective view of a ball detent of the contactless trigger of FIG. 3, according to some embodiments.

With reference to FIGS. 9-10B, the selector 204 may move along an axis D in a first direction and a second direction, the second direction being opposite from the first direction. When the selector 204 moves along the axis D in the first direction, a first wall 356 of the recessed portion walls 304 of the selector 204 comes into contact with the first side 332 of the upwardly extending portion 324. Since the first side 332 is curved, as the first wall 356 biases the first side 332, the upwardly extending portion 324 rotates the intermediate portion 320 and, thus, the center pin portion 316, about an axis E (see FIGS. 8, 10A), which extends through the center of the center pin portion 316, in a direction F (see FIG. 9). At this time, the ball detent 340 is moved out of the second recession 350, which acts as a neutral positon, and along the outside surface of the center pin portion 340. As the first wall 356 continues to bias the first side 332, the center pin portion 316 continues to rotate. Continued rotation of the center pin portion 316 and, thus, the magnet 328, is inhibited by the ball detent 340 being received in the first recession 348, such that the center pin portion 316 is locked in a first position (shown in FIG. 10B).

When the selector 204 moves along the axis D in the second direction, a second wall 360 of the recessed portion walls 304 of the selector 204 comes into contact with the second side 336 of the upwardly extending portion 324. Since the second side 336 is curved, as the second wall 360 biases the second side 336, the upwardly extending portion 324 rotates the intermediate portion 320 and, thus, the center pin portion 316, about the axis E in a direction opposite to that of the direction F. As the second wall 360 continues to bias the second side 336, the center pin portion 316 continues to rotate. Continued rotation of the center pin portion 316 and, thus, the magnet 328, is inhibited by the ball detent 340 being received in the second recession 350, such that the center pin portion 316 is locked in the neutral position (shown in FIG. 10B). Continued force imparted by the second wall 360, moves the ball detent 340 out of the second recession 350, along the surface of the center pin portion 340, and into the third recession 352, where the center pin portion 316 is locked in a second position.

As the camming assembly 300 rotates between the first position and the second positon, the magnetic field of the magnet 328 varies relative to stationary elements of the assembly, such as the PCB 418. This variation of the magnetic field is detected by a magnetic field sensor 420 located on the PCB 418. In one embodiment, the magnetic field sensor 420 is a digital magnetic field sensor configured to transition from a first digital level to a second digital level based on the digital magnetic field sensor detecting a change in the magnetic polarity of the magnet 328. The change in polarity is caused by the rotation of the magnet 328 and its associated poles.

In one example, the PCB 418 may extend out of a housing 208 of the contactless trigger assembly 200. This configuration can allow the PCB 418 to extend into the tool 100, thereby providing additional PCB space. For example, as illustrated in FIGS. 3 and 8, a portion of the PCB 418 extends downward out of the housing 208.

Figure 11:
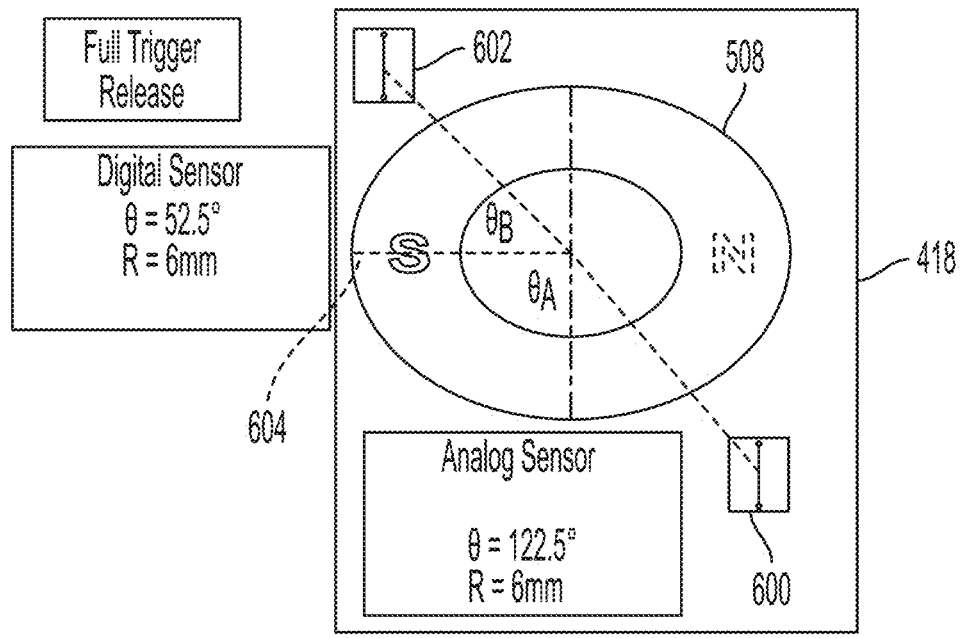
FIG. 11 is a functional diagram illustrating the interface between a magnet and multiple magnetic sensors with an input device in a first position, according to some embodiments.
Figure 12:
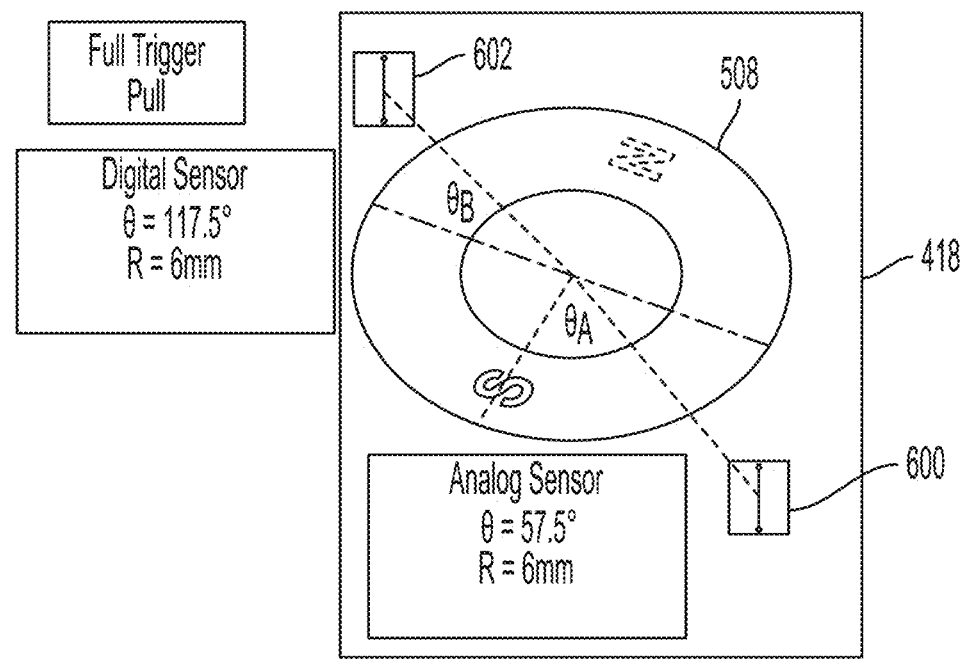
FIG. 12 is a functional diagram illustrating the interface between the magnet and magnetic sensors of FIG. 11 with an input device in a second position, according to some embodiments.

FIGS. 11-12 are a functional diagram illustrating the annular magnet 508 in communication with an analog magnet sensor 600 and a digital magnetic sensor 602, according to some embodiments. In some embodiments, the analog magnet sensor 600 and the digital magnetic sensor 602 are both mounted on the PCB 418, described above. In FIG. 11, the annular magnet 508 is in a position associated with the trigger shoe 228 being in a fully released position. As shown, the analog magnetic sensor 600 is detecting a magnetic field generated by the annular magnet. As shown in FIG. 11, the magnetic field is a result of the magnet flux received by the analog sensor based on the analog sensor 600 being located at an angle of $\theta_A$ from a centerline axis 604 of the annular magnet 508. The digital magnetic sensor 602 detects a magnetic field based on the digital sensor 602 being located at an angle of $\theta_B$ from the centerline axis 604. The digital magnetic sensor 602 may be an omni-directional Hall effect sensor with a normally high state that goes low as the magnet transitions to a different polarity, thereby making the digital sensor 602 insensitive to strong external fields. The annular magnet 508 is shown to have two poles (for example, a north pole and a south pole). As shown in FIG. 11, the boundary between the two poles bisects the diameter of the magnet. A similar magnet design is used in regards to the forward/reverse selector 204.

FIG. 12 shows the annular magnet being in a position associated with the trigger shoe 228 being in a fully pulled positon. The annular magnet is now positioned such that the south pole of the magnet is positioned in proximity to the analog magnetic sensor 600, such that the analog magnetic sensor 600 receiving a magnetic field based on the analog sensor being located at an angle of $\theta_A$ to the centerline 604. Accordingly, the annular magnet is now positioned such that the north pole of the magnet is positioned in proximity to the digital magnetic sensor 602, and is receiving a magnetic field based on the digital sensor 602 being located at an angle of $\theta_B$ to the centerline 604. Both the analog sensor 600 and the digital sensor 602 may be rotational Hall effect magnetic sensors that are configured to measure a magnetic flux density vector component that enters the face of the sensor, and outputs either a linear proportional signal, or a digital signal. Thus, the magnetic sensors 600, 602 are not being used to measure a flux based on a distance to a magnetic element. Rather, the magnetic sensors 600, 602 measure an angle of the respective sensor to the magnet based on a received magnetic flux density vector component, thereby allowing the distance between the sensors 600, 602 and the magnet to remain constant during operation.

Figure 13:
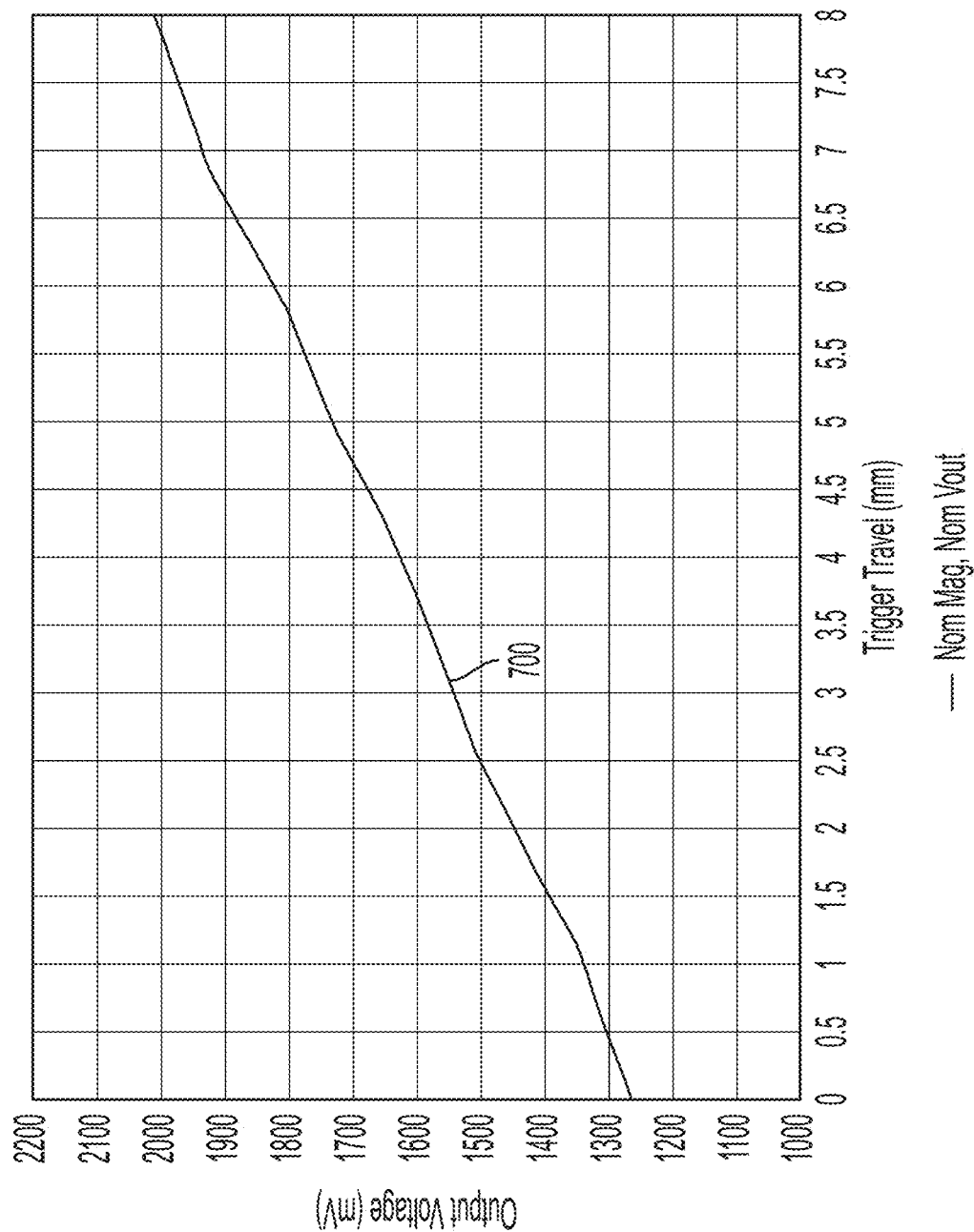
FIG. 13 is a graph illustrating an output of an analog magnetic sensor versus an amount of trigger travel, according to some embodiments.

FIG. 13 is a graph showing an example output of an analog magnetic sensor, such as magnetic sensor 600, in relation to travel distance of the trigger shoe 228. As shown in FIG. 13, the output of the analog sensor increases in a generally linear fashion as the trigger shoe 228 moves from an initial relaxed position (depressed 0 mm) to a fully depressed position (depressed 8 mm), as shown by output trend line 700. The particular voltage levels and travel distances are merely examples, as different levels and distances are used in other embodiments. Further, in some embodiments, the relationship between the travel distance of the trigger shoe 228 and the analog output of the magnetic sensor 600 is non-linear, such as logarithmic or exponential. In some embodiments, the output of the magnetic sensor 600 is a voltage. However, in other embodiments, the output is a current (e.g. 4-20 mA) or a digital value.

Figure 14A:
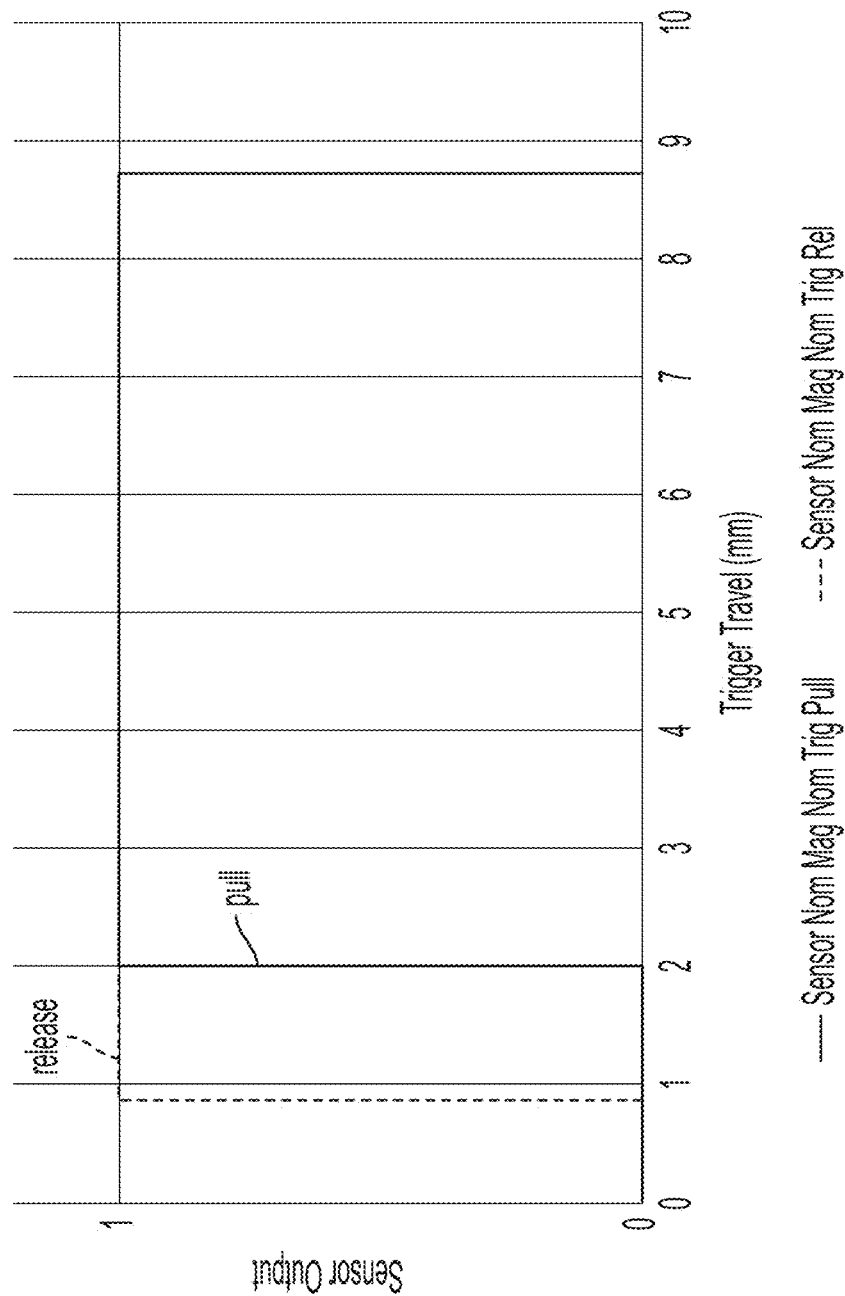
FIG. 14A is a graph illustrating an output of a digital magnetic sensor versus an amount of trigger travel, according to some embodiments.

FIG. 14A is a graph showing an example output of a digital magnetic sensor, such as magnet sensor 602 and/or the digital magnetic sensor 420 used by the forward-reverse selector 204. As shown in FIG. 8, the output of the digital sensor varies between a digital high ("1"), and a digital low ("0"). As also shown in FIG. 14A, during a trigger pull, the digital magnetic sensor 602 transitions to a digital high when the trigger shoe 228 travel is approximately 2 mm. However, the digital magnetic sensor 602 may be configured to transition to a digital high when the trigger shoe 228 travel distance is less than 2 mm or greater than 2 mm in some embodiments. The digital sensor is further shown to transition back to a digital low during the release of the trigger shoe 228. For example, the digital sensor 602 may transition back to a digital low when the trigger shoe 228 is within 0.9 mm of the fully released position. However, the digital magnetic sensor 602 may also be configured to transition to a digital low when the trigger shoe 228 is less than 0.9 mm of the fully released position, or more than 0.9 mm of the fully released position.

Similarly, a transition between a digital high and a digital low may also be output by the digital magnetic sensor 420 used by the forward-reverse selector 204. For example, the digital magnetic sensor 420 may output a digital high when the forward-reverse selector 204 is in the first locked position. In other embodiments, the digital magnetic sensor 420 may output a digital high when the forward-reverse selector 204 is in the second locked position. In some embodiments, the digital magnetic sensor 420 may transition to a digital low signal when the forward-reverse selector 204 is moved out of either the first locked position or the second locked position, depending on the configuration of the tool. In other embodiments, the digital magnetic sensor 420 may only transition between digital states when the forward-reverse selector 204 is moved to one of the first or second locked positions. For example, the digital magnetic sensor 420 may transition to a digital high when the forward-reverse selector 204 is placed in the first locked position, and transition to a digital low when the forward-reverse selector is placed in the second locked position, or vice versa.

Figure 14B:
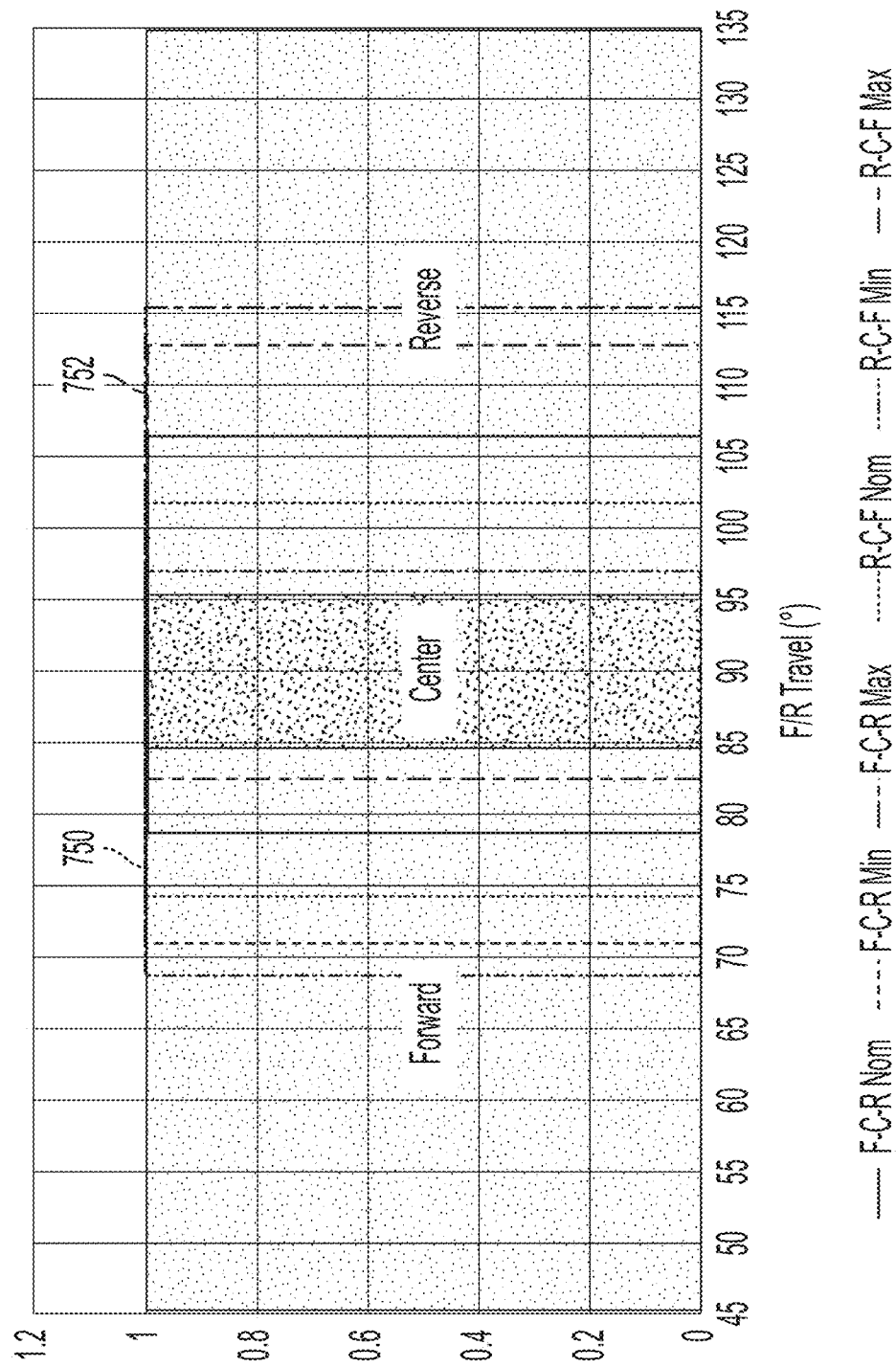
FIG. 14B is a graph illustrating an output of a dual output digital magnetic sensor versus an amount of travel of a selector device, according to some embodiments.

FIG. 14B is a graph showing an example output of a dual output digital magnetic sensor, such as the digital magnetic sensor 420 used by the forward-reverse selector 204 in some embodiments. As shown in FIG. 14B, the digital magnetic sensor 420 may be configured to output a first digital high at a first output when the forward-reverse selector 204 is in a first position, a second digital high at a second output when the forward-reverse selector 204 is in a second position, and a digital low on both the first output and the second output when the forward-reverse selector 204 is in a third position. For example, when the forward-reverse selector 204 is in the "forward" position, a first digital high 750 may be output via the first output of the digital magnetic sensor 420. Conversely, when the forward-reverse selector 204 is in the "reverse" position, a second digital high 752 is output via the second output of the digital magnetic sensor 420. Finally, if the forward-reverse selector 204 is in the "center" or locked position, there is a digital low at both the first output and the second output of the digital magnetic sensor 420. The first and second outputs may be in communication with a controller via two or more I/O ports of the controller. As shown in FIG. 14B, the transitions to digital highs can be varied based on a desired amount of rotation of the magnet 328. For example, a rotation of 5 degrees may be sufficient to cause a transition from the digital magnetic sensor 420. However, rotations of more than 5 degrees or less than 5 degrees are also contemplated.

Figure 15:
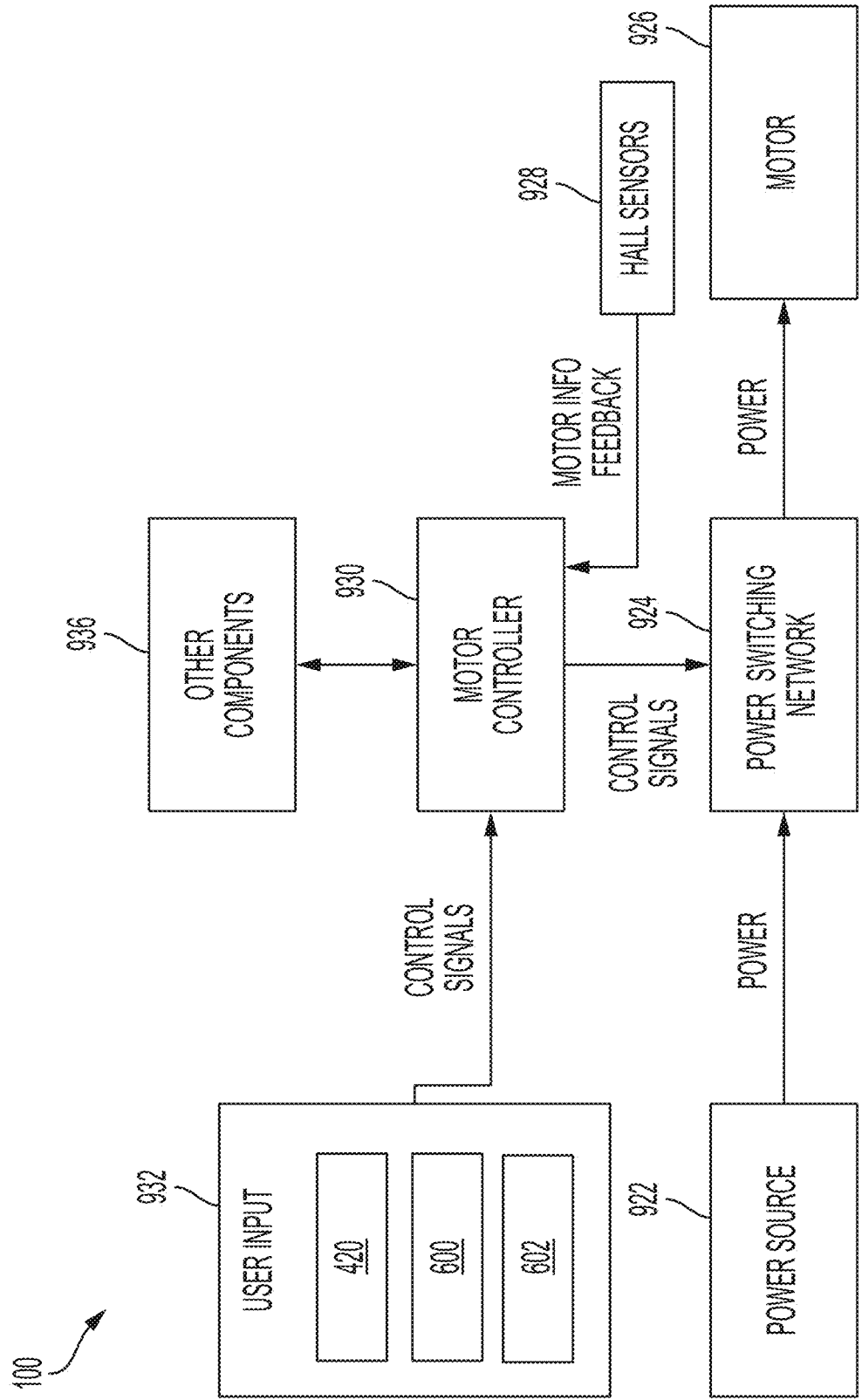
FIG. 15 is a block diagram of a brushless power tool, according to some embodiments.

FIG. 15 illustrates a simplified block diagram of a brushless power tool, such as power tool 100, according to some embodiments. The power tool 100 is shown to include a power source 922, a power switching network 924, a motor 926, Hall-effect sensors 928, a motor controller 930, user input 932, and other components 936 (e.g., battery pack fuel gauge, work lights [LEDs], current/voltage sensors, etc.). The power source 922 provides DC power to the various components of the power tool 100 and may be a power tool battery pack that is rechargeable and uses, for instance, lithium ion cell technology. In some instances, the power source 922 may receive AC power (e.g., 120V/60 Hz mains power) from a tool plug that is coupled to a standard wall outlet, and then filter, condition, and rectify the received power to output DC power. Each Hall-effect sensor 928 outputs motor feedback information, such as an indication (e.g., a pulse) when a magnet of the rotor rotates across the face of that Hall-effect sensor 928. Based on the motor feedback information from the Hall-effect sensors 928, the motor controller 930 can determine the position, velocity, and acceleration of the rotor.

In some embodiments, the motor controller 930 includes a memory storing instructions and an electronic processor coupled of the memory to retrieve and execute the instructions to thereby implement the functionality of the controller 930 described herein. The motor controller 930 is also configured to receive control signals from the user inputs 932, such as by depressing the trigger shoe 228 or actuating the forward-reverse selector 204. An output associated with the operation of the user inputs 932 may be provided to the motor controller 930 via the analog and digital magnetic sensors described above, such as analog sensor 600, and digital sensors 420 and 602. Examples of the control signals provided by the user inputs 932 are shown in FIGS. 13 and 14, described above. In some embodiments, the digital sensor 420 may provide a control signal (e.g., a digital signal) to the controller indicating a position of the forward-reverse selector 204, which in turn instructs the controller 930 to operate the motor 926 in either a forward or reverse direction, which may be controlled via the power switching network 924, as described below.

Figure 16:
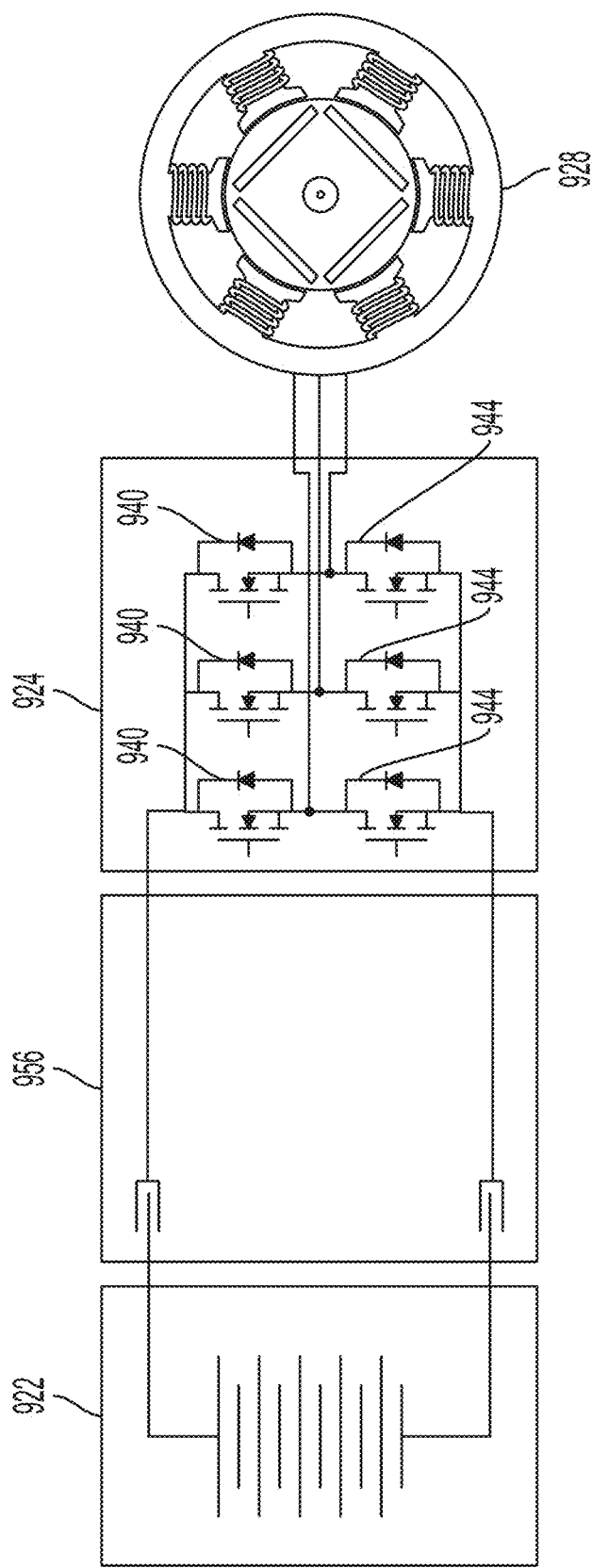
FIG. 16 is a circuit diagram of the power switching network described in FIG. 15, according to some embodiments.

In response to the motor feedback information the control signals received via the user inputs 932, the motor controller 930 transmits control signals to the power switching network 924 to drive the motor 926, as explained in further detail with respect to FIG. 16. In some embodiments, the power tool 100 may be a sensorless power tool that does not include a Hall-effect sensor 928 or other position sensors to detect the position of a rotor of the motor 926. Rather, the rotor position may be detected based on the inductance of the motor 926 or the back electromotive force (emf) generated in the motor 926. Although not explicitly illustrated, the motor controller 930 and other components of the power tool 100 are electrically coupled to the power source 922 such that the power source 922 provides power thereto.

FIG. 16 illustrates a circuit diagram of the power switching network 924. The power switching network 924 includes a number of high side power switching elements 940 (e.g., field effect transistors [FETs]) and a number of low side power switching elements 944 (e.g., FETs). The motor controller 930 provides the control signals to control the high side FETs 940 and the low side FETs 944 to drive the motor based on the motor feedback information and user controls described above. For example, in response to detecting a pull of the trigger shoe 228 and the input from forward-reverse selector 204, the motor controller 930 provides the control signals to selectively enable and disable the FETs 940 and 944 (e.g., sequentially, in pairs) resulting in power from the power source 922 to be selectively applied to stator coils of the motor 926 to cause rotation of a rotor. More particularly, to drive the motor 926, the motor controller 920 enables a first high side FET 940 and first low side FET 944 pair (e.g., by providing a voltage at a gate terminal of the FETs) for a first period of time. In response to determining that the rotor of the motor 926 has rotated based on a pulse from the Hall-effect sensors 928, the motor controller 930 disables the first FET pair, and enables a second high side FET 940 and a second low side FET 944. In response to determining that the rotor of the motor 926 has rotated based on pulse(s) from the Hall-effect sensors 928, the motor controller 930 disables the second FET pair, and enables a third high side FET 940 and a third low side FET 944. This sequence of cyclically enabling pairs of high side FET 940 and low side FET 944 repeats to drive the motor 926. Further, in some embodiments, the control signals include pulse width modulated (PWM) signals having a duty cycle that is set in proportion to the amount of trigger pull of the trigger shoe 228 (as indicated by the output of the magnetic sensor 600), to thereby control the speed or torque of the motor 926.

Figure 17:
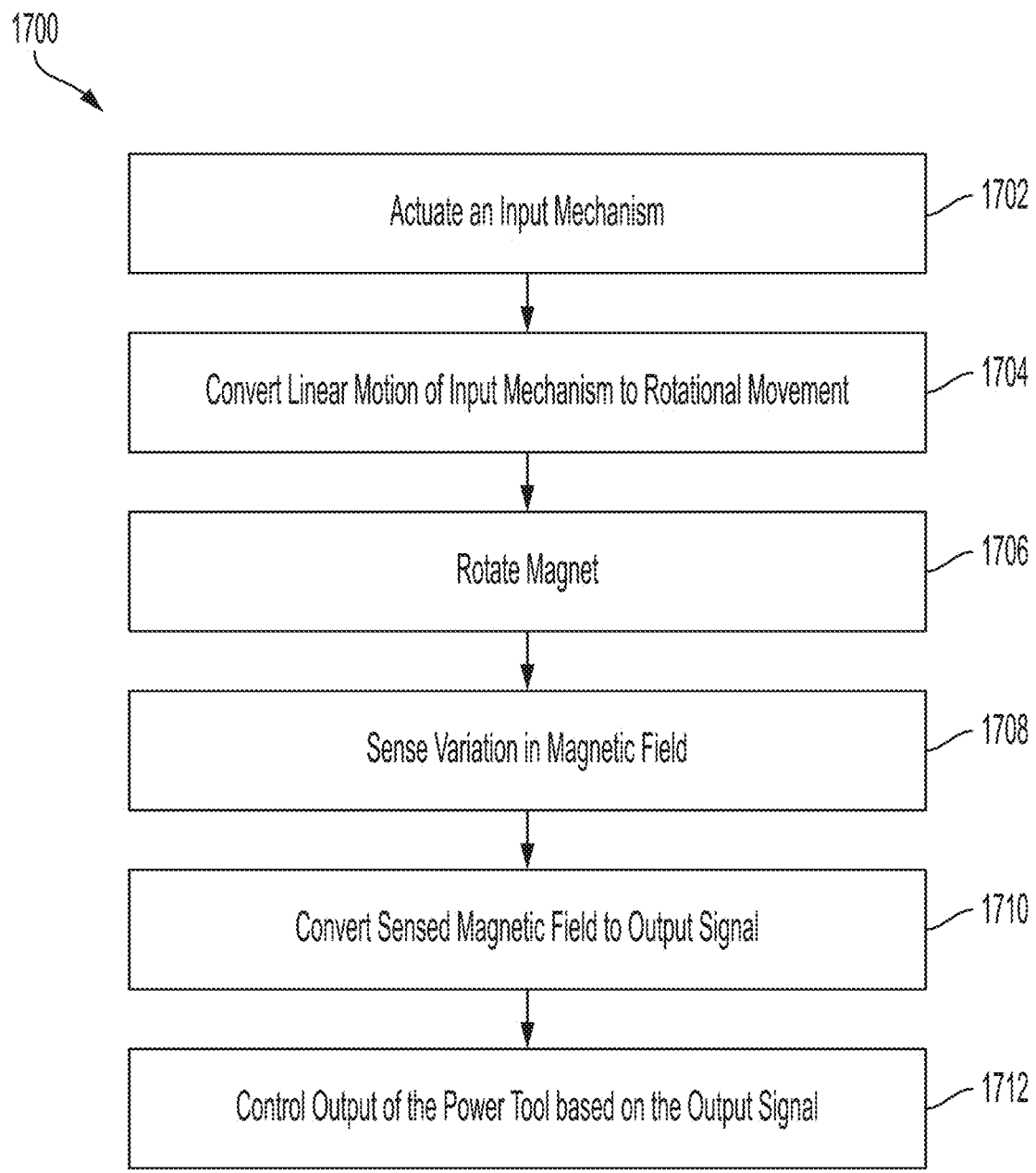
FIG. 17 is a flow chart illustrating a process for controlling the output of an electric power tool, according to some embodiments.

FIG. 17 is a process 1700 for controlling the output of an electric power tool, such as power tool 100 is described, according to some embodiments. At process block 1702 an input trigger of the electric power tool is actuated. For example, the input trigger may be the trigger shoe 228 described above. However, other input triggers such as pushbuttons, levers, and the like may also be used. In some embodiments, the input trigger is actuated in a first linear direction (e.g., a linear pulling of the trigger shoe 228). At process block 1704, the linear actuation of the input trigger is converted to a rotational movement via one or more mechanical interfaces. In some embodiments, the linear motion of the input trigger is converted to a rotational movement using the contactless trigger assembly 200 described above. However, other configurations for converting the linear movement of the input trigger to a rotational movement are also contemplated.

At process block 1706, the rotational movement is transferred to a magnet of the electric power tool, such as annular magnet 284 described above. For example, the magnet may be coupled to the rotating arm 288 as described above. Thus, the magnet is rotated based on the actuation of the input trigger.

At process block 1708, an analog sensor detects variation in a magnetic field generated by the rotating magnet. In one embodiment, the sensor is a rotational Hall-effect magnetic sensor. The analog sensor may be configured to detect a change in a magnetic flux density component, which results from the rotation of the magnet. At process block 1710, the analog sensor converts the sensed magnetic field to an output signal, which may be provided to a controller, such as motor controller 930, as described above. In some embodiments, the output of the analog sensor is a voltage that varies linearly with the rotation of the magnet as shown in FIG. 13. However, in other examples, the output may be a non-linear output, such as a stepped output, a logarithmic output, etc.

At process block 1712, the controller 930, upon receiving the output of the analog sensor, controls an output of the electric tool based on the received analog sensor output. For example, the motor controller 930 receives the output from the analog sensor 600 and drives the motor 926 by controlling the power switching network 924 based on the output from the analog sensor 600, as described above. In one example, the motor controller 930 drives the power switching network 924 to control the output power to the motor 926 in a non-linear operation, as shown in motor drive profile 1800 shown in FIG. 18.

Figure 18:
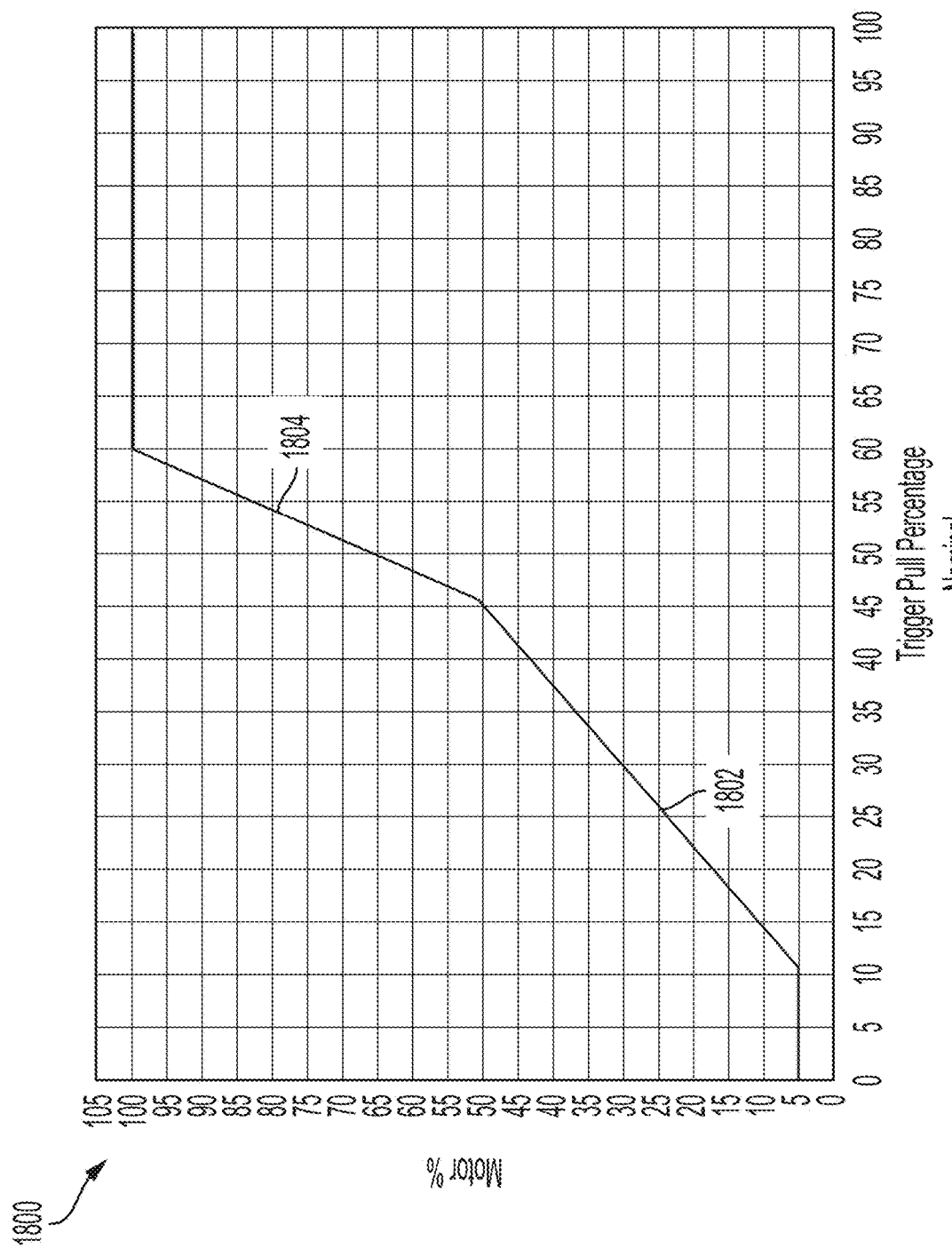
FIG. 18 is a graph illustrating a motor drive profile of an electric tool, according to some embodiments.

As shown in FIG. 18, a first region 1802 includes lower speeds that allow for more precise control by a user (e.g., through modulating the depressed amount of the shoe 228). Subsequently, the second region 1804 allows the tool to reach full speed earlier in the output range of the sensor (e.g. earlier in the trigger pull). As shown in FIG. 18, the controller 930 may be configured to operate the output of the tool at 100% power (e.g., with a pulse width modulated signal driving the power switching network 924 at 100% duty ratio) when the trigger pull reaches 60% of full travel. This arrangement enables the output of the tool to be at 100% power across the tolerance range of the trigger shoe 228 or other input trigger. As described above, the output of the electric tool may be a rotational output, wherein the controller controls the rotational speed of the rotational output based on the received sensor output. In some embodiments, the controller also receives a control signal from the magnetic sensor 420 associated with the forward-reverse selector 204. The motor controller 930 may then control the output of the power tool based on both the received output of the analog sensor 600 and the control signal from the magnetic sensor 420 to control the output of the tool at a desired output level and also in the desired direction.

In some embodiments, in block 1708, a digital magnetic sensor, such as digital magnetic sensor 602 senses the variation in the magnetic field in addition to or instead of the analog sensor. In these embodiments, the digital magnetic sensors convert the sensed magnetic field to a digital output, such as that shown in FIG. 14, at process block 1710. Additionally, in process block 1712, the digital output may be received by the controller 930 of the electric tool to initiate certain functions, such as instructing the controller to "wake-up" or initialize in order to operate the tool. For example, if the digital magnetic sensors output a digital high to the controller, the controller 930 may "wake-up" or enter a normal mode from a "sleeping" or low-power mode. For example, the controller 930 may enter a low-power mode after the electronic tool has been inactive for a predetermined period of time (e.g. two hours). In some embodiments, as noted above, the analog sensor 600 is not included and the annular magnet 284 is in communication with only the digital magnetic sensor 602. For example, in some embodiments, where the tool 100 operates at a single speed, includes a separate speed adjusting mechanism (e.g., a jigsaw with a speed dial), or is a tool that includes a cyclic motor operation that is enabled upon a trigger pull (e.g., a nailer or stapler), only the digital sensor 602 is included to detect the annular magnet 284. Thus, the control signal from the digital sensor 602 to the motor controller 930 acts as an enable signal to the controller 930 and, in process step 1712, the controller 930 drives the motor 926 in response to receiving the enable signal from the digital sensor 602.

Figure 19C:
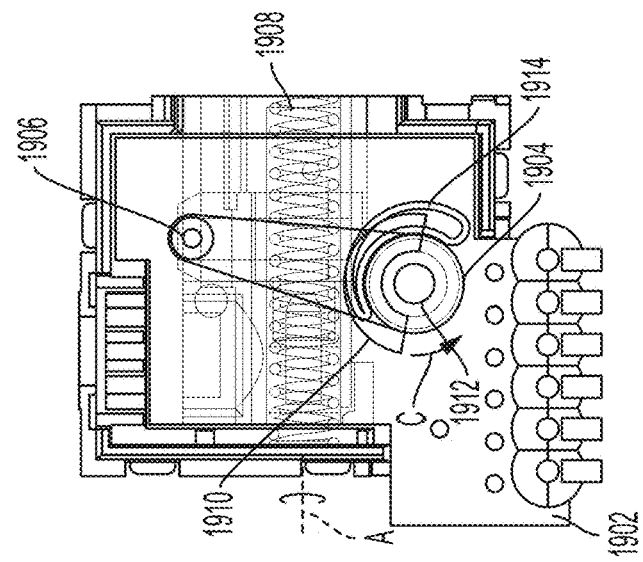
FIGS. 19A, 19B, and 19C are top views of an alternative contactless trigger assembly, according to some embodiments.
Figure 19B:
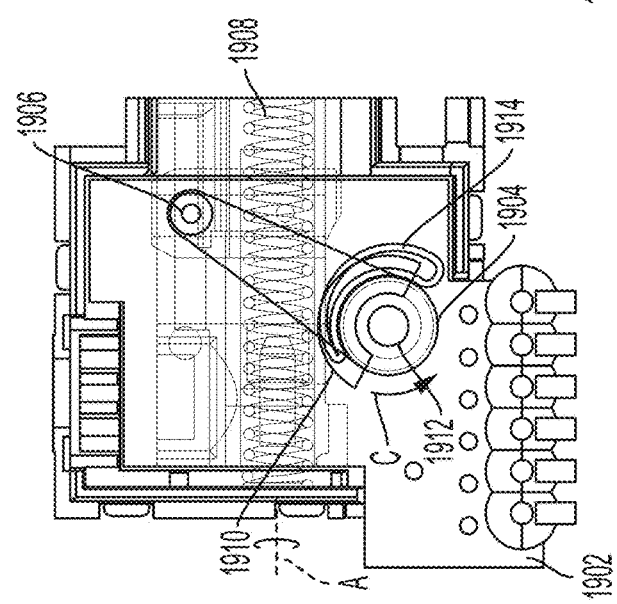
Figure 19A:
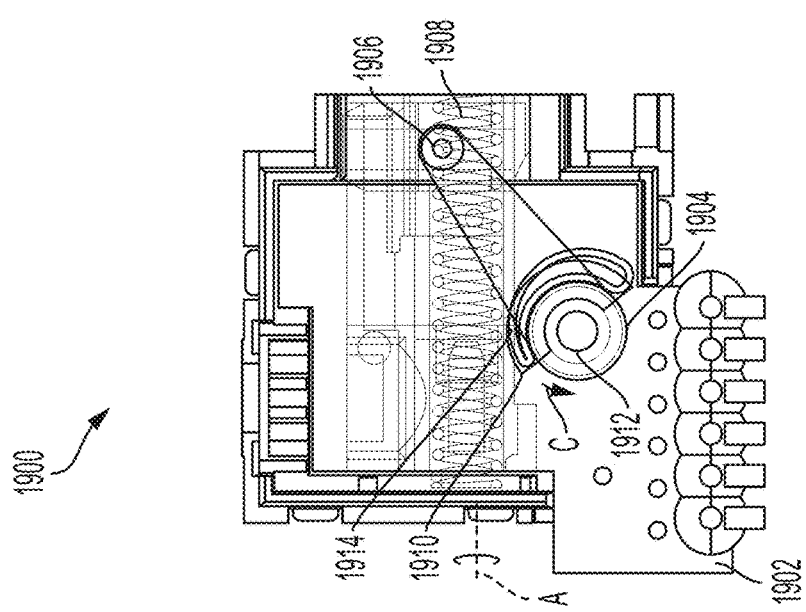

FIGS. 19A-19C illustrate an alternative embodiment of a contactless trigger assembly 1900, such as contactless trigger assembly 200 described above. Similar to the contactless trigger assembly 200, the contactless trigger assembly 1900 includes a printed circuit board 1902, and an arm 1904. Similar to the contactless trigger assembly 200, the arm 1904 may be moveably coupled to a cam 1906 of a moveable plunger 1908. As the moveable plunger 1908 moves along the axis A, the arm 1904 is rotated in direction C. The contactless trigger assembly 1900 further includes a metallic member 1910 coupled to the arm 1904 at a pivoting cam 1912, and is configured to rotate with the arm 1904. In one embodiment, the metallic member 1910 is constructed out of a ferrous material. In other embodiments, the metallic member 1910 may be constructed out of a non-ferrous material. Example metallic materials may include iron, steel, aluminum, copper, and the like. An inductive coil 1914 is coupled to the circuit board 1902, and is positioned between the circuit board 1902 and the arm 1904. In some embodiments, an electrical current is provided to the inductive coil to generate a magnetic field.

As the arm 1904 rotates in a direction C, the metallic member 1910 also rotates in the direction C. As shown in FIG. 19, the metallic member 1910 and the inductive coil 1914 are not contiguous annular shapes, but rather are curved arcs that, depending on the position of the movable plunger, overlap by a certain degree. Rotation of the metallic member 1910 causes the amount of the ferrous member 1910 to vary, thereby altering a strength of a magnetic field generated by the inductive coil 1914, which is in turn detected by a sensor on the printed circuit board 1902. The variance in the sensed magnetic field may be correlated to a position of the trigger. Sensing the strength of a varying magnetic field eliminates the need for a rotational magnetic field sensor. In one embodiment, the sensor is an analog rotational magnetic field sensor. In other embodiments, the sensor is an inductive sensor configured to sense the strength of the magnetic field generated by the inductive coil 1914.

As described above, the arm 1904 rotates in a direction C along with the ferrous member 1910. As the arm 1904 rotates the portion of the inductive coil 1914 covered by the metallic member 1910 changes. As shown in FIG. 19A, the trigger (not shown) is in the relaxed position causing the arm to be in a first position. In the first position, the metallic member 1910 is positioned such that it covers the entire length of the inductive coil 1914. As the arm 1904 moves due to a movement of the trigger into a second position as shown in FIG. 19B, the portion of the metallic member 1910 covering the inductive coil 1914 is reduced by a value proportional to the movement of the arm 1904. As the arm 1904 reaches the maximum travel position, as shown in FIG. 19C, the portion of the metallic member 1910 covering the inductive coil 1914 is further reduced. By reducing the amount of the inductive coil 1914 covered by the inductive member 1910, a magnetic field is varied, which is detected by the sensor. The sensor is configured to provide an output to a controller, such as motor controller 930, representative of the sensed inductive value, which may then be used to control an output of a power tool, such as described above.

Figure 20C:
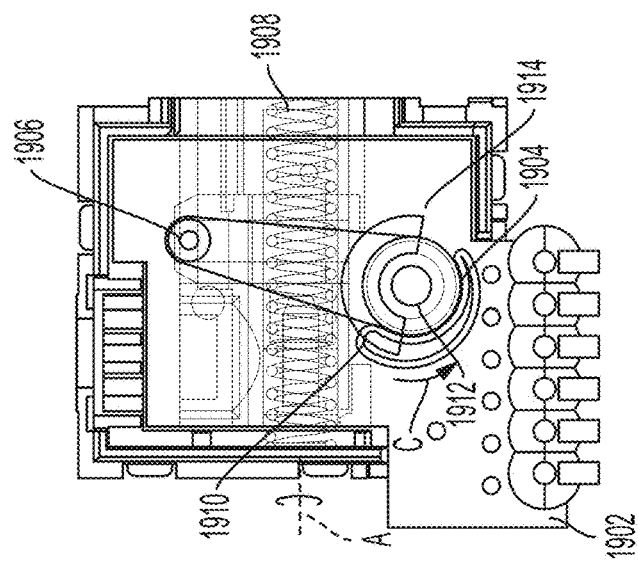
FIGS. 20A, 20B, and 20C are top views of an alternate configuration of the contactless trigger assembly of FIGS. 19A-19C, according to some embodiments.
Figure 20B:
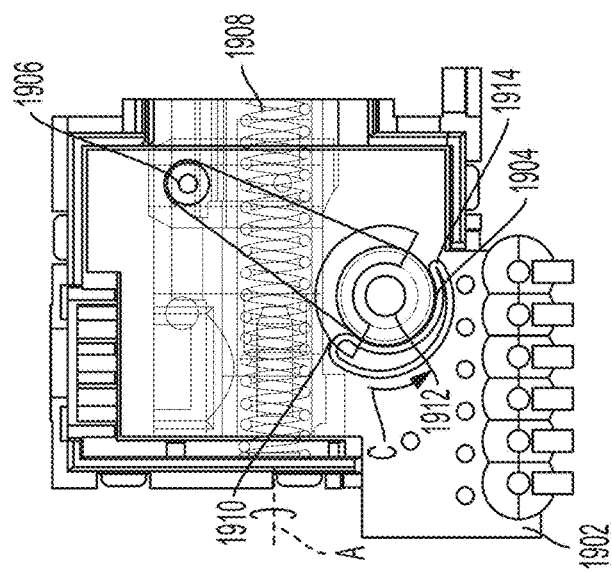
Figure 20A:
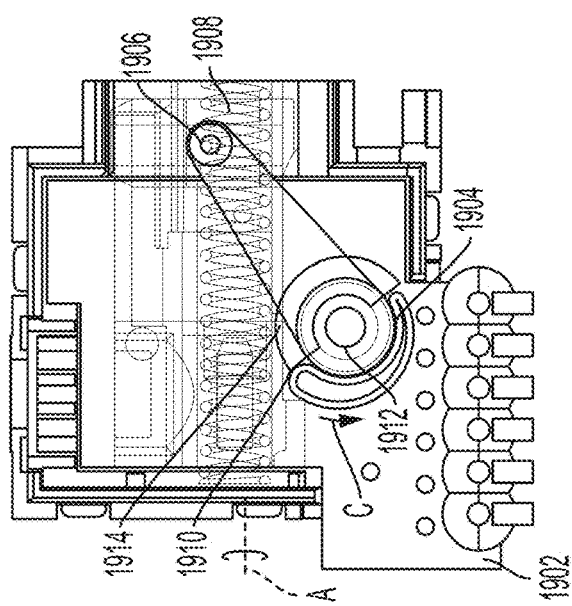

FIGS. 20A-20C illustrates an alternative embodiment of the contactless trigger assembly 1900 as contactless trigger assembly 2000. The components and operation of the trigger assembly 200 are similar to that of trigger assembly 1900, and it is understood that the components and operation of the contactless trigger assembly 2000 are the same as those in contactless trigger assembly 1900, unless noted otherwise below. As shown in FIG. 20A, the inductive coil 1914 is positioned such that no part of the metallic member 1910 covers the inductive coil 1914 when the trigger is in the relaxed position (e.g. not depressed). In FIG. 20A, the trigger (not shown) is in the relaxed (e.g. not depressed) position causing the arm to be in a first position. In the first position, the metallic member 1910 is positioned such that it does not cover any portion (or a minimal portion) of the inductive coil 1914. As the arm 1904 moves due to a movement of the trigger into a second position as shown in FIG. 20B, the portion of the metallic member 1910 covering the inductive coil is increased by a value proportional to the movement of the arm 1904. As the arm 1904 reaches the maximum travel position, as shown in FIG. 20C, the portion of the metallic member 1910 covering the inductive coil 1914 is further increased. By increasing the amount of the inductive coil 1914 covered by the metallic member 1910, a magnetic field value is varied, which is detected by a sensor on the printed circuit board 1902. The sensor is configured to provide an output to a controller, such as motor controller 930, representative of the sensed magnetic field value, which may then be used to control an output of a power tool, such as described above.

In some embodiments, the inductive coil 1914 of trigger assembly 1900 and/or trigger assembly 2000 may be configured to include multiple receiving traces or conductors that are sinusoidal in shape, but offset by 90°, so that when the metallic member 1910 rotates, the voltage induced in one of the traces/conductors is a sine wave and the voltage in the other trace/conductor is a cosine wave. The voltage output of the two traces/conductors is sensed by a sensor, such as a TX Sine Cosine sensor, and can then be provided to a controller, such as motor controller 930. The motor controller 930 may then determine a location (e.g. rotational angle) of the metallic member 1910 with respect to the traces/conductors of the inductive coil 1914. In some embodiments, the angle is generated by the motor controller 930 using an arctangent function, $a = \arctan v_{sin}/v_{cos}$. In some embodiments, the sine-cosine sensor can achieve a resolution of approximately 0.15° for detecting the position of the metallic member 1910, and a detection accuracy of greater than 98%.

Thus, embodiments described herein provide, among other things, a contactless trigger assembly for a power tool. Various features and advantages are set forth in the following claims.

What is claimed is:

1. A trigger assembly for a power tool comprising:
   a moveable plunger coupled having a first end and a second end, wherein the first end is coupled to a magnet;
   a trigger shoe coupled to a second end of the moveable plunger; and
   a sensor configured to sense a magnetic field of the magnet,
   wherein movement of the trigger shoe rotates the magnet and alters the magnetic field sensed by the sensor.

2. The trigger assembly of claim 1, wherein the sensor is electrically connected to a controller of the power tool, the controller configured to control an output of the power tool.

3. The trigger assembly of claim 2, wherein the sensor is configured to output a signal to the controller based on the sensed magnetic field.

4. The trigger assembly of claim 3, wherein the output is a voltage indicative of a position of the trigger shoe.

5. The trigger assembly of claim 1, wherein the magnet is an annular magnet configured to rotate based on movement of the arm.

6. The trigger assembly of claim 5, wherein the sensor is configured to sense a change in the magnetic field of the annular magnet in response to the annular magnet rotating.

7. The trigger assembly of claim 1, further comprising:
   a selector disposed on a surface of a housing of the trigger assembly;
   a pin including a first end that is engageable with the selector and a second end that is coupled to a selector magnet; and
   a selector sensor configured to sense a magnetic field of the selector magnet,
   wherein axial motion of the selector rotates the selector magnet and alters the magnetic field sensed by the sensor.

8. The trigger assembly of claim 7, wherein the selector sensor is configured to sense a polarity of the selector magnet and output a digital signal to a controller based on the sensed polarity.

9. The trigger assembly of claim 8, wherein the controller is configured to execute an operating mode selected from a plurality of operating modes of the power tool based on the digital signal received from the selector sensor.

10. The trigger assembly of claim 9, further comprising an arm having a first side that is moveably connected to the first end of the moveable plunger and a second side that is coupled to the magnet.

11. A method for controlling an output of an electric power tool, the method comprising:
    actuating a trigger shoe of the electric power tool in a first linear direction;
    converting linear movement of the movable plunger into a rotational movement of a movable arm in a first rotational direction;
    rotating an annular magnet coupled to the movable arm in the first rotational direction;
    sensing a parameter of a magnetic field generated by the annular magnet at a first magnetic sensor; and
    controlling, via the controller, the output of the electric power tool based on the sensed parameter.

12. The method of claim 11, wherein the output of the electric power tool is a rotational speed.

13. The method of claim 11, wherein the sensed parameter is a magnetic flux density vector component.

14. The method of claim 11, wherein the first magnetic sensor is an analog rotational magnetic field sensor.

15. The method of claim 11, further comprising sensing a parameter of the magnetic field generated by the annular magnet at a second magnetic sensor, wherein the second magnetic sensor is a digital magnetic sensor.

16. The method of claim 15, further comprising initiating a wake-up process for the controller based on the controller receiving an output of the second magnetic sensor.

17. A trigger assembly, comprising:
a trigger assembly including:
a housing;
a selector disposed on a surface of the housing;
a pin including a first end that is engageable with the selector and a second end that is coupled to a selector magnet; and
a selector sensor configured to sense a magnetic field of the selector magnet,
wherein axial motion of the selector rotates the selector magnet and alters the magnetic field sensed by the sensor.

18. The power tool of claim 17, wherein the trigger assembly further comprises:
a trigger shoe configured to be actuated in a first linear direction, wherein actuation of the trigger shoe moves a movable plunger in the first linear direction,
a movable arm configured to rotate an annular magnet coupled to the movable arm in the first rotational direction, and
a magnetic sensor configured to sense a first parameter of a magnetic field generated by the annular magnet; and
a controller configured to receive the output voltage from the magnetic sensor and control an output of the power tool based on the sensed parameter.

19. The power tool of claim 18, further comprising:
a second magnetic sensor configured to sense a second parameter of the annular magnet and transmit an output to the controller, wherein the second magnetic sensor is a digital magnetic sensor, and the second parameter is a polarity of the annular magnet.

20. The power tool of claim 19, wherein the controller is further configured to initiate a wake-up process for the controller based on the controller receiving the output of the second magnetic sensor.

* * * * *